US005807659A

United States Patent [19]

Nishimiya et al.

[11] Patent Number: 5,807,659
[45] Date of Patent: Sep. 15, 1998

[54] PHOTOSENSITIVE PRINTING PLATE

[75] Inventors: Nobuyuki Nishimiya; Hiroyuki Nagase, both of Shizuoka, Japan

[73] Assignee: Fuji Photo Film Co., Ltd., Minami-ashigara, Japan

[21] Appl. No.: 978,876

[22] Filed: Nov. 26, 1997

Related U.S. Application Data

[63] Continuation of Ser. No. 621,869, Mar. 19, 1996, abandoned.

[30] Foreign Application Priority Data

Mar. 22, 1995 [JP] Japan .................................. 7-062919
Apr. 11, 1995 [JP] Japan .................................. 7-0865647

[51] Int. Cl.$^6$ .............................. G03F 7/00; B41N 1/00
[52] U.S. Cl. ................ 430/302; 430/278.1; 430/288.1; 430/272.1; 101/456
[58] Field of Search .......................... 430/272.1, 288.1, 430/278.1, 302; 101/456

[56] References Cited

U.S. PATENT DOCUMENTS

| | | | |
|---|---|---|---|
| 4,782,000 | 11/1988 | Lauke et al. | 430/60 |
| 5,061,605 | 10/1991 | Kawamura et al. | 430/281 |
| 5,334,486 | 8/1994 | Abe et al. | 430/288 |
| 5,503,074 | 4/1996 | Hirano et al. | 101/456 |

Primary Examiner—Janet C. Baxter
Assistant Examiner—Rosemary Ashton
Attorney, Agent, or Firm—Burns, Doane, Swecker & Mathis, LLP

[57] ABSTRACT

A negative photosensitive lithographic printing plate comprising an aluminum or organic polymer support having a surface roughness Ra of 0.25 to 0.60 μm and having provided thereon a photopolymerizable photosensitive layer comprising a polymerizable monomer, a photopolymerization initiator and a sensitizer having an absorbing wavelength of 400 to 1,000 nm, wherein the support has a functional group on its surface at the side of the photosensitive layer, and wherein the functional group has an unsaturated bond which can undergo a radical addition reaction and an Si atom which covalently bonds to an aluminum atom, an Si atom, or a carbon atom in the support via an oxygen atom.

15 Claims, No Drawings

PHOTOSENSITIVE PRINTING PLATE

This application is a continuation of application Ser. No. 08/621,869, filed Mar. 19, 1996 now abandoned.

FIELD OF THE INVENTION

The present invention relates to a photosensitive printing plate. Particularly, the present invention relates to a negative type photosensitive printing plate (hereinafter referred to as a "PS plate (presensitized plate)") which can be written by laser light.

BACKGROUND OF THE INVENTION

Negative type PS plates have been widely known. Examples thereof include ones having a photosensitive layer containing a photo-curable diazo resin, ones having a photopolymerizable photosensitive layer, and ones having a photo-crosslinkable photosensitive layer. The terms "photopolymerizable" and "photo-crosslinkable" mean that an active species formed by light causes polymerization and crosslinking in an organic layer, respectively. To make a printing plate from such a PS plate, an original of a transparent negative film is placed on the PS plate having one of these photosensitive layer, which is then exposed to an ultraviolet ray through the original. Even a letter original must be once reproduced on the negative film before exposing the PS plate to the ray, which results in troublesome processing.

Therefore, attempts have been intensively made to directly prepare a printing plate by scanning a PS plate with a narrow laser beam. Thus a letter original or an image original being directly formed on the PS plate which contains a certain polymerizable layer of high sensitivity as the photosensitive layer without using any intermediate film original. For example, printing plates can be directly made without the intervention of film originals by use of photosensitive compositions described in, e.g., JP-B-61-9621 (The term "JP-B" as used herein means an "examined Japanese patent publication"), JP-A-63-178105 (The term "JP-A" as used herein means an "unexamined published Japanese patent application"), and JP-A-2-244050.

However, these customary photopolymerizable printing plates of high sensitivity fail to form strong adhesion between the photosensitive layer and a support. Consequently, it happens to these printing plates that image areas break off or thin lines drop out when numbers of sheets are printed at a high speed.

SUMMARY OF THE INVENTION

An object of the invention is to provide a PS plate in which a photosensitive layer strongly adheres to a support by photo-induced adhesive power, wherein the photopolymerizable photosensitive layer of high sensitivity is subjected to exposure and subsequent polymerization, which prevents image areas from breaking off or prevents thin lines or halftone dots of highlight from dropping out during printing to ensure an excellent press life (printing durability); and wherein the PS plate is directly written by laser light.

This and other objects of the present invention have been attained by a negative photosensitive lithographic printing plate comprising an aluminum or organic polymer support having a surface roughness Ra of 0.25 to 0.60 $\mu$m and having provided thereon a photopolymerizable photosensitive layer comprising a polymerizable monomer, a photopolymerization initiator and a sensitizer having an absorbing wavelength of 400 to 1,000 nm, wherein the support has a functional group on its surface at the side of the photosensitive layer, and wherein the functional group has an unsaturated bond which can undergo a radical addition reaction and an Si atom which covalently bonds to an aluminum atom, an Si atom or a carbon atom in the support via an oxygen atom.

That is, the addition-reactive functional group, which is implanted on a support by a covalent bond, adheres to the photopolymerizable photosensitive layer by light adhesive power, which allows the photosensitive layer to strongly adhere to the support. In addition, the functional group has a density low enough to maintain the hydrophilicity of the support in non-image areas to make it possible to print without any stain.

DETAILED DESCRIPTION OF THE INVENTION

The supports for use in the present invention include aluminum plates, plastics, paper, and composites thereof, and aluminum plates are preferably used among these.

The aluminum plates for use in the present invention are preferably selected from pure aluminum plates, alloy plates containing aluminum as a main component and trace amounts of other elements, and aluminum-laminated or aluminum-deposited plastic films. Examples of the other elements contained in the aluminum alloy plates include silicon, iron, manganese, copper, magnesium, chromium, zinc, bismuth, nickel, and titanium. The contents of the other elements in the alloys are 10% by weight or less. Pure aluminum is preferred in the present invention; however, aluminum contaminated with a trace amount of the other elements may be used because thoroughly purified aluminum is difficult to manufacture under present refining techniques. Thus, the aluminum plates appropriately used in the present invention do not always have a certain composition, but are those which are formed of known, generally used materials such as JIS A 1050, JIS A 1100, JIS A 3103, and JIS A 3005. The thickness of the aluminum plates for use in the present invention is from about 0.1 to about 0.6 mm.

The supports for use in the present invention are usually grained. Methods of graining include electrochemical graining in which the surface of a plate is electrochemically grained in an electrolytic solution of hydrochloric acid or nitric acid, wire-brush graining in which the surface is brushed with metallic wires, ball graining in which the surface is grained with abrasive balls and an abrasive agent, and mechanical graining such as brush graining in which the surface is grained with a nylon brush and an abrasive agent. These methods of graining are used singly or in combination.

The aluminum supports thus grained are preferably subjected to chemical etching by acids or alkalis. When the acids are used as etching agents, they take a long time to destroy fine structures of the surfaces, and consequently, it is commercially disadvantageous to apply the acids to the etching in the present invention. On the other hand, the alkalis are preferably used as etching agents.

Preferable examples of alkali agents used include sodium hydroxide, sodium carbonate, sodium aluminate, sodium metasilicate, sodium phosphate, potassium hydroxide, and lithium hydroxide. The concentration thereof is preferably from 1 to 50%, and the temperature thereof is preferably from 20° to 100° C. The amount of dissolved aluminum is preferably adjusted to 5 to 20 g/m$^2$.

After the etching, the aluminum supports are washed with acids to remove residual smuts from the surfaces thereof. Examples of the acids include nitric acid, sulfuric acid, phosphoric acid, chromic acid, hydrofluoric acid, and borofluoric acid. Preferable smut-removing treatment after electrochemical surface roughening includes a method of bringing the surfaces into contact with 15 to 65% by weight of sulfuric acid at a temperature of 50° to 90° C. as described in JP-A-53-12739 and a method of alkali etching described in JP-B-48-28123.

The thus treated aluminum alloy plates themselves can be used as the supports to which the addition-reactive functional group covalently bonds in accordance with the present invention. Moreover, they may be subjected to a treatment such as anodizing treatment and formation treatment, if needed.

The anodizing treatment can be carried out according to methods ordinarily conducted in this field. Specifically, the anodizing treatment is conducted in an aqueous solution or in a nonaqueous solution of sulfuric acid, phosphoric acid, chromic acid, oxalic acid, sulfamic acid, benzenesulfonic acid or a mixture of two or more thereof by sending direct current or alternating current to form an anodizing layer on the surface of the aluminum support.

Since the conditions of anodizing vary depending upon electrolytic solutions used, they are not particularly limited. Generally, the electrolytic solutions have a concentration of from 1 to 80% by weight and a temperature of from 5° to 70° C., the current density is from 0.5 to 60 A/dm$^2$, the voltage is from 1 to 100 V, and the electrolytic period is from 10 to 100 sec.

Preferable anodizing methods include an anodizing method carried out at a high current density in sulfuric acid as described in British Patent 1,412,768 and an anodizing method carried out in an electrolytic solution of phosphoric acid as described in U.S. Pat. No. 3,511,661.

After the anodizing treatment, the surfaces of the aluminum supports are subjected to a hydrophilic treatment, if needed. The hydrophilic treatment in the present invention includes a treatment with an alkali metal silicate (for example, an aqueous solution of sodium silicate) as disclosed in U.S. Pat. Nos. 2,714,066, 3,181,461, 3,280,734, and 3,902,734. In this treatment, the supports are soaked or electrolyzed in the aqueous solution of sodium silicate.

Additionally, examples thereof include a treatment with potassium fluorozirconate disclosed in JP-B-36-22063 and a treatment with polyvinyl phosphonic acid as disclosed in U.S. Pat. Nos. 3,276,868, 4,153,461 and 4,689,272.

Further, after the graining and anodizing treatments, the surfaces of the aluminum supports may preferably undergo pore-sealing treatment. The treatment is carried out by dipping the plates in hot water or a hot aqueous solution of an inorganic salt or an organic salt, or by a steam bath.

In accordance with the present invention, the addition-reactive supports are prepared from the supports thus obtained by bonding covalently an addition-reactive functional group to the surfaces thereof. To prepare the addition-reactive supports, the functional group which can bring about a radical addition reaction is covalently implanted on the surfaces of the supports in which the surface roughness (Ra) of the supports measured with a stylus of 2 μmR prior to the introduction of the addition reactive-functional group is from 0.25 to 0.60 μm. A photo-polymerizable photosensitive layer which exhibits a sensitivity to a ray having a wavelength of 400 to 1,000 nm is formed on the addition-reactive supports. Images are allowed to write on the PS plates thus prepared with the aid of a laser to evaluate performances thereof. As a result, the highlight press life of the PS plates is equivalent to a negative PS plate FNSA (produced by Fuji Photo Film Co., Ltd.) or higher than that without depending on Ra values of the surface thereof. On the other hand, when the Ra values are adjusted to 0.6 μm or less by controlling the concentration of hydrochloric acid or nitric acid, current wave shape and a quantity of electricity in the electrochemical graining and/or by selecting the kind of brushes and applied pressure in the brush graining, the solid press life of the PS plates also become equivalent to the PS plate FNSA or higher than that. The Ra value exceeding 0.60 μm causes the solid press life to be decreased while a value less than 0.25 μm results in deterioration in water receptivity.

Therefore, the surface roughness Ra of the supports usable in the present invention is from 0.25 to 0.60 μm, and preferably from 0.30 to 0.55 μm.

In the present invention, the surface roughness (Ra) was represented by values measured with a stylus of 2 μmR by use of stylus meter SURFCOM manufactured by Tokyo Seimitsu Co., Ltd.

In the present invention, a functional group which can bring about a radical addition reaction (hereinafter abbreviated as a "addition-reactive functional group") is covalently bonded to the surfaces of the above-mentioned supports. The addition-reactive functional groups are not particularly limited, as long as they can bring about a radical addition reaction. Examples thereof include $CH_2=CHCOO-(CH_2)_3-$, $CH_2=C(CH_3)COO-(CH_2)_3-$, $CH_2=CH-C(=CH_2)-$, $CH_2=CH-SO_2NH-(CH_2)_3-$,

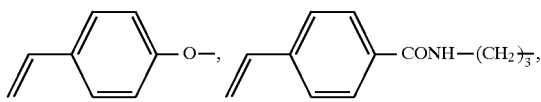

$CH_2=CH-$, $HC\equiv C-$, $CH_3C\equiv C-$,

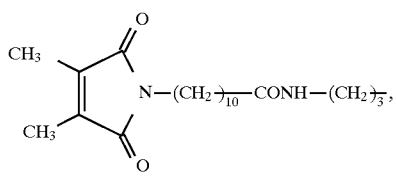

$CH_2=CHCH_2O-$, $CH_2=CHCOO-(CH_2)_4-$, $CH_2=C(CH_3)COO-(CH_2)_4-$, $CH_2=C(CH_3)COO-(CH_2)_5-$, $CH_2=CHCH_2-$, $HO-CH_2-C=C-$, $CH_3CH_2CO-C\equiv C-$, $CH_2=CHS-(CH_2)_3-$, $CH_2=CHCH_2O-(CH_2)_2-SCH_2-$, $CH_2=CHCH_2S-(CH_2)_3-S-$, $(CH_3)_3C-CO-C\equiv C-$, $CH_2=CHCH_2NH-(CH_2)_3-$, $(CH_2=CH)_2-N-(CH_2)_2-SCH_2-$,

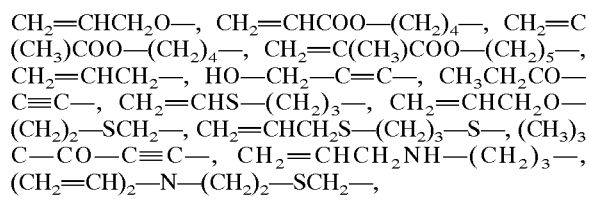

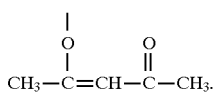

Implantation of the addition-reactive functional group on the surface of a support is carried out using an organic silicon compound as a starting material. For example, a support is coated with an organic silicon compound represented by the following formula (1):

$$R_1Si(R_2)_3 \quad (1)$$

wherein $R_1$ represents the addition-reactive functional group; and $R_2$ represents a hydrolyzable alkoxyl group or —$OCOCH_3$. Some of $R_2$ groups react with a metal atom, a metal oxide, a metal hydroxide, a hydroxyl group, or a silanol group formed by preliminary formation of the support to form a covalent bond between the silicon atom in formula (1) and the surface of the support. Thus, the functional group represented by the following formula (2) is bonded to the surface to the support.

$$\begin{array}{c} R_1 \\ | \\ R_3-Si-R_3 \\ | \end{array} \quad (2)$$

wherein $R_3$ represents the same groups as those defined as $R_2$ or a hydroxyl group, or may combine with an silicon atom of another adjacent group represented by formula (2), with the proviso that $R_3$ may be partly replaced by a group on a solvent molecule used for coating to be a group different from $R_2$.

Furthermore, the organic silicon compounds used as starting materials may contain 2 or more addition-reactive functional groups ($R_1$) on the central silicon atom as shown in the following formulas (1a) and (1b) instead of the compounds represented by formula (1):

$$\begin{array}{c} R_1 \\ \diagdown \\ \quad Si(R_2)_2 \\ \diagup \\ R_1 \end{array} \quad (1a)$$

$$\begin{array}{c} R_1 \\ | \\ R_1-Si-R_2 \\ | \\ R_1 \end{array} \quad (1b)$$

wherein $R_2$ has the same meaning as above.

Moreover, when the addition-reactive functional group $R_1$ bonds to the central silicon atom via an oxygen atom and is hydrolyzable, organic silicon compounds represented by the following formula (1c) may be used:

$$\begin{array}{c} R_1 \\ | \\ R_1-Si-R_1 \\ | \\ R_1 \end{array} \quad (1c)$$

The organic silicon compounds represented by formula (1) themselves may be applied to the supports, or ones diluted with an appropriate solvent may be applied to the supports. Water and/or catalysts may be added to the organic silicon compounds to form strong bonds between the compounds and the surfaces of the supports. The solvents are preferably alcohols such as methanol, ethanol, propanol, 2-propanol, ethylene glycol, and hexylene glycol. The catalysts are preferably acids such as hydrochloric acid, acetic acid, phosphoric acid, and sulfuric acid, or bases such as ammonia and tetramethyl-ammonium hydroxide.

Although the number of the addition-reactive functional group on a support varies with the kind of the functional group bonding to the support, it is generally from 0.01 to 400, preferably from 0.1 to 40, and more preferably from 1 to 10, per 100 Å$^2$ of the support. The number of the addition-reactive functional group less than 0.01 per 100 Å$^2$ makes it difficult to obtain sufficient adhesive power induced by light. The organic silicon compounds may be repeatedly applied to increase the thickness thereof, which makes it possible to substantially increase the number of the addition-reactive functional group per 100 Å$^2$. However, the number of the addition-reactive functional group which sticks out of the most external layer thereof is at most 10 per 100 Å$^2$ and, consequently, a too thick layer merely results in waste of the organic silicon compound. The number of the addition-reactive functional group per 100 Å$^2$ is preferably 400 or less, because too many addition-reactive functional groups also cause the hydrophilicity of the PS plates to be deteriorated.

When the addition-reactive functional groups are bonded to (implanted on) the surfaces of the supports using the organic silicon compounds, the number of the addition-reactive functional groups implanted on the surfaces is preferably controlled so as to be within the above-mentioned range by changing various conditions such as the kind and amount of solvents for diluting the organic silicon compounds, the amount of water used for the hydrolysis on the surfaces of the supports (if water is added), the kind and amount of the catalysts used for promoting the hydrolysis on the surfaces of the supports (if they are added), processes for applying the solutions of the organic silicon compounds to the supports, and process parameters for drying such as atmosphere, temperature and time after applying the solutions.

The number of the addition-reactive functional groups kept by the surfaces of the supports can be determined by analyzing quantitatively the amount of silicon atoms and the amount of carbon-carbon multiple bonds according to appropriate methods of measuring the treated surfaces of the supports such as fluorescent X-ray analysis and infrared spectroscopy.

When the PS plates are prepared from the supports having the addition-reactive functional groups bonded (hereinafter abbreviated as the "addition-reactive support"), the organic silicon compounds represented by formula (1) which are singly applied to the supports may cause scumming. That is, when the above-mentioned organic silicon compounds are singly used, non-image areas which should receive water also receive ink as well as water because of excessive existence of the organic functional groups on the areas, which may cause scumming to be observed on printed matter. In the present invention, in addition to the addition-reactive functional groups ($R_1$), a number of hydroxyl groups also are preferably implanted on the surfaces of the supports to increase the hydrophilicity thereof, thus preventing printed matter from scumming. That is, in the implantation of the addition-reactive functional groups on the surfaces of the supports, the organic silicon compounds represented by the following formula (3) are preferably used together with the organic silicon compounds represented by formula (1).

$$Si(R_4)_4 \quad (3)$$

wherein $R_4$ represents a hydrolyzable group such as an alkoxy group, an aryloxy group, or —$OCOCH_3$, or $R_4$ may be the same as $R_2$ or may be different from $R_2$. That is, reaction sites represented by formula (2) are bonded to the surface of the support, and hydrophilic sites represented by the following formula (4) which contain no organic functional group are also bonded to the surface thereof at the same time.

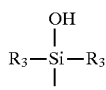

(4)

In formula (4), R$_3$ is most preferably a hydroxyl group because of its hydrophilicity. When R$_3$ is a group other than a hydroxyl group, hydrophilicity can be increased by washing the surface with an alkaline solution, as needed.

The ratio of the organic silicon compounds represented by formula (1) to the organic silicon compounds represented by formula (3) cannot be definitely determined, because the respective compounds represented by formulas (1) and (3) exhibit different efficiency of bond to (implantation on) the surfaces of the supports depending upon the properties of the supports. It is therefore preferred that conditions under which the photo-induced adhesion stemming from the addition-reactive functional group R$_1$ is compatible with the hydrophilicity stemming from a partial structure (4) are experimentally searched by treating practically the supports in various ratios between the respective organic silicon compounds represented by formulas (1) and (3). In short, it is important that the density of the addition-reactive functional groups is adjusted within the above-mentioned range. The molar ratio of the organic silicon compounds represented by formula (3) to the organic silicon compounds represented by formula (1) is suitably from 0.05 to 200, preferably from 0.2 to 100, and more preferably from 1 to 40.

Within this range, as the amount of the hydrophilic groups stemming from the organic silicon compounds represented by formula (3) increases, the hydrophilicity of the non-image areas increases. However, even when the density of the hydrophilic groups is low, it is also possible to improve the density of the hydrophilic groups by subjecting the addition-reactive functional groups to a treatment for hydrophilicity.

In the implantation of the addition-reactive functional group on the surface of the support, the organic silicon compounds are conveniently allowed to undergo hydrolysis and condensation polymerization prior to coating, and the thus formed organic-inorganic composites in which the addition-reactive functional groups are bonded to inorganic polymers containing —Si—O—Si— bonds are applied to the surface of the support. The method for utilizing the composites (hereinafter abbreviated as an "SG method") is preferably used.

When the supports which are metals or metal oxides are coated with the organic-inorganic composites and dried, the inorganic polymeric portions of the composites adhere to the substrate, and the addition-reactive functional groups themselves remain on the surfaces of the supports.

According to the methods of implanting the addition-reactive functional group by the SG method, the organic silicon compounds represented by formula (1) are mixed with the organic silicon compounds represented by formula (3) in a desired proportion, as needed, and the mixtures are allowed to undergo hydrolysis and condensation polymerization at —R$_2$ and —R$_4$, not at the addition-reactive functional group R$_1$, in liquid in the presence of a catalyst, if necessary, thus forming liquid compositions containing inorganic polymers in which central silicon atoms are bonded with —Si—O—Si— bonds. The compositions are applied to the surface of the support, and then dried, as needed, to bond the addition-reactive functional groups to the support.

In the SG method, the distribution of the addition-reactive functional groups fixed on the surface of the support does not largely depend upon the distribution of chemical properties of the surface such as acidic sites or basic sites. Furthermore, when the organic silicon compounds represented by formula (1) are used together with the organic silicon compounds represented by formula (3) as the starting materials, it is advantageous that the determination of formulation to obtain the most suitable surface is relatively easily carried out, because the ratio between the addition-reactive functional group sites represented by the above-mentioned formula (2) and hydrophilic sites represented by the above-mentioned formula (4) is almost determined by the ratio between the respective organic silicon compounds represented by formulas (1) and (3) used as the starting materials.

Examples of the organic silicon compounds represented by the above-mentioned formula (1) used in the present invention include

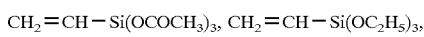

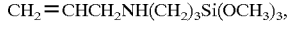

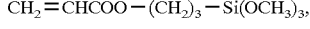

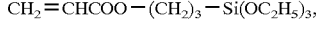

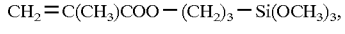

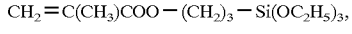

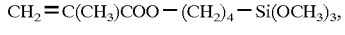

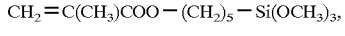

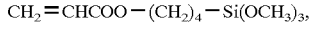

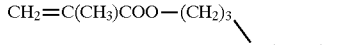

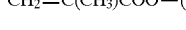

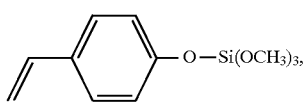

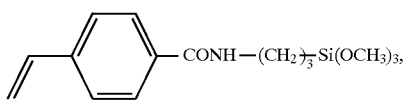

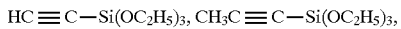

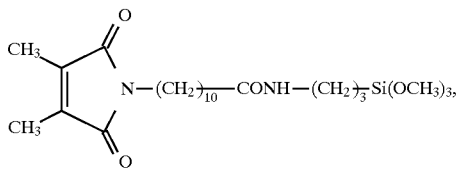

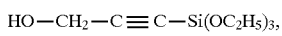

$CH_3CH_2CO-C{\equiv}C-Si(OC_2H_5)_3$, $CH_2{=}CHS-(CH_2)_3-Si(OCH_3)_3$, $CH_2{=}CHCH_2O-(CH_2)_2-SCH_2-Si(OCH_3)_3$, $CH_2{=}CHCH_2S-(CH_2)_3-S-Si(OCH_3)_3$, $(CH_3)_3CCO-C{\equiv}C-Si(OC_2H_5)_3$, $(CH_2{=}CH)_2N-(CH_2)_2-SCH_2-Si(OCH_3)_3$,

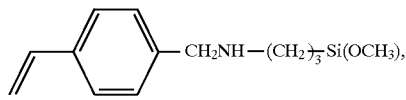$-CH_2NH-(CH_2)_{\overline{3}}Si(OCH_3)$, $CH_3COCH{=}C(CH_3)-O-Si(OCH_3)_3$.

Examples of the organic silicon compounds represented by formula (3) include tetramethoxysilane, tetraethoxysilane, tetraisopropoxysilane, tetra(n-propoxy) silane, tetra(n-butoxy)silane, tetrakis(2-ethylbutoxy)silane, tetrakis(2-ethylhexyloxy)silane, tetrakis(2-methoxyethoxy) silane, tetraphenoxysilane, and tetraacetoxysilane. Tetraethoxysilane is preferably used among these silanes.

Examples of solvents usable for preparing compositions suitable for the SG method in which the organic silicon compounds represented by formulas (1) and (3) are allowed to undergo the hydrolysis and condensation polymerization are alcohols such as methanol, ethanol, 1-propanol, 2-propanol, ethylene glycol, and hexylene glycol.

The content of the solvents is generally from 0.2 to 500 times, preferably from 0.5 to 5.0 times, and more preferably from 1 to 3 times, based on the total weight of the used organic silicon compounds represented by formulas (1) and (3). The content less than 0.2 times may preferably cause the reaction solution to gel with time, whereas the content exceeding 500 times disadvantageously takes several days to complete the reaction.

The amount of water to be added to hydrolyze the organic silicon compounds is generally from 0.5 to 1,000 mol, preferably from 1 to 100 mol, and more preferably from 1.5 to 10 mol, per mol of the organic silicon compounds. The amount of water less than 0.5 mol per mol of the organic silicon compounds causes the proceeding of the hydrolysis and subsequent condensation polymerization to be markedly retarded, which disadvantageously takes several days to be able to carry out safe surface treatment. On the other hand, the amount of water exceeding 1,000 mol per mol of the organic silicon compounds causes the resulting compositions to fail to strongly adhere to metal surfaces and to deteriorate the stability of the composition with time, usually gelling immediately. This makes stable operation of coating difficult.

The reaction temperature for preparing compositions suitable for the SG method is usually from room temperature to about 100° C. However, temperatures below room temperature or above a temperature of 100° C. can also be applied, depending upon the kind of catalysts described below. Use of higher temperature than the boiling points of solvents is also possible, and a reaction vessel may be preferably equipped with a reflux condenser, as needed.

Examples of the catalysts used, as needed, include acids such as hydrochloric acid, sulfuric acid, nitric acid, phosphoric acid, acetic acid, malic acid, and oxalic acid; and bases such as ammonia, tetramethylammonium hydroxide, potassium hydroxide, and sodium hydroxide. The content of these catalysts is from 0.001 to 1 mol, preferably from 0.002 to 0.7 mol, and more preferably from 0.003 to 0.4 mol, per mol of the organic silicon compounds, based on the total amount of the organic silicon compounds represented by formula (1) and the organic silicon compounds represented by formula (3) which may be added to the former compounds, as needed. The content of the catalysts exceeding 1 mol does not particularly bring about economic profit, compared to the effect expected from the amount of the catalysts added.

When a weak acid such as acetic acid and malic acid is used as the catalyst, the reaction temperature is advantageously maintained in a range of 40° to 100° C. On the other hand, when a strong acid such as sulfuric acid and nitric acid is used as the catalyst, it is preferably maintained in a range of 10° to 60° C. When phosphoric acid is used as the catalyst, the reaction can be carried out at 10° to 90° C.

In many cases, heat is applied in a process for preparing the compositions used for the SG method and in a process for applying the compositions to the substrates and drying. When a volatile acid is used as the catalyst, it may attach to surrounding units to corrode them. In these processes which are carried out using units mainly made of iron, non-volatile sulfuric acid and/or phosphoric acid are preferably used as the catalysts.

As mentioned above, when the compositions which comprise the organic silicon compounds represented by formulas (1) and (3), an organic solvent, water, and a catalyst, as needed, are allowed to react under properly selected conditions of reaction temperature and reaction time and, further, of stirring, if necessary, the hydrolysis and the condensation polymerization occur to form a polymer or a colloidal polymer containing Si—O—Si bonds, so that the viscosity of the liquid composition increases to form a sol.

To form the sol by using the organic silicon compounds represented by formulas (1) and (3), both of them may be placed in a reaction vessel at the beginning of the reaction, or either of them may be subjected to the hydrolysis and the condensation polymerization to some extent and then the other is added to the reaction mixture to complete the reaction.

If the sol thus prepared in the SG method is placed at room temperature, the condensation polymerization may successively proceeds so that the sol may change into a gel. Therefore, the sol thus prepared can be previously diluted with a solvent to be used for applying the sol to a support to inhibit or retard the proceeding of this phenomenon.

To bond a desired amount of the addition-reactive functional group to a support and to control uneven distribution of the organic silicon compounds or the addition-reactive functional group on the coated surface of the support, the resulting solution is preferably adjusted to a suitable concentration by adding the solvent prior to coating. Solvents usable for this purpose are alcohols, and methanol is particularly preferably used. However, other solvents can also be used, and organic compounds, inorganic additives, surfactants, and so forth can also be added to the solution.

Examples of the other solvents include methyl ethyl ketone, ethylene glycol monomethyl ether, ethylene glycol monoethyl ether, 2-methoxyethyl acetate, 1-methoxy-2-propyl acetate, dimethoxyethane, methyl lactate, ethyl lactate, acetylacetone, and ethylene glycol. Examples of the organic compounds which can be added to the solution include epoxy resins, acrylic resins, butyral resins, urethane resins, novolak resins, pyrogallol-acetone resins, polyvinylpyrrolidone, polyvinyl alcohol, polyvinyl methyl ether, and polypropylene glycol.

Examples of the inorganic additives include colloidal silica and colloidal alumina.

High-boiling solvents such as ethylene glycol and ethylene glycol monomethyl ether contribute to improvement in stability of the solution diluted to an extent that application to the support can be conducted, and also to the reproducibility of the reaction of the addition-reactive functional group bonded to the support. Although the organic compounds such as novolak resins and pyrogallol-acetone resins offer the similar effect, they adversely cause the hydrophilicity of the resulting surface of the support to be deteriorated. Therefore, the amount thereof must be finely adjusted.

The sol or the liquid composition suitable for the SG method is applied to the surface of the support, and then air-dried or dried by heating so that the inorganic polymers comprising Si—O—Si bonds undergo gelation and covalently bond to the surface of the support at the same time. Although drying is carried out to remove a solvent, water and also a catalyst, as needed, by vaporization, application of heat may be continued, even after drying, to ensure the adhesion of the organic silicon compound to the support, if necessary.

The temperature of the drying and post heating continued, if necessary, needs to be in a range capable of controlling decomposition of the addition-reactive functional groups represented by $R_1$. Consequently, the temperature capable of applying is from room temperature to 200° C., preferably from room temperature to 150° C., and more preferably from room temperature to 120° C.

A drying time is generally from 30 sec to 30 min, preferably from 45 sec to 10 min, and more preferably from 1 to 3 min.

Methods of coating of the liquid compositions (the organic silicon compounds, the solution thereof, or the sol thereof) usable for the present invention include brushing, dip coating, atomizing, spin coating, doctor blade coating, and so forth. The method is practically adopted in view of the surface form of the support and film thickness to be formed. Particularly, the dip coating makes double-side coating possible, and the layer formed on the back surface of an aluminum plate, accordingly, offers the effect of preventing aluminum from dissolving in a developer.

The functional group which can bring about a radical addition reaction is bound to the support according to the above-mentioned method. Therefore, a laser beam-sensitive PS plate of high sensitivity which is excellent in adhesion between a photosensitive layer and a support can be prepared by forming a photopolymerizable photosensitive layer having high sensitivity to a ray of the 400 to 1,000 nm region on the layer containing the functional group.

To make a printing plate from the PS plate thus prepared, a narrowed laser beam is allowed to scan the PS plate to form a radical in its exposed areas, in which the radical initiates polymerization in the photosensitive layer and also give rise to an addition reaction at the interface between the photosensitive layer and the addition-reactive functional group to directly form a polymerization pattern on the PS plate in accordance with an original such as a letter original and an image original, followed by removing unexposed areas by dissolving in an aqueous alkaline solution, an organic alkali solution, or water, as needed.

In the present invention, the photopolymerizable photosensitive layer which comprises a photopolymerization initiator and a sensitizer having an absorbing wavelength of 400 to 1,000 nm is formed on the support to which the addition-reactive functional group bonds. The photopolymerizable photosensitive layer preferably comprises a composition comprising the following compounds (i) to (iv); however, the present invention is not limited to the composition, and any photopolymerizable photosensitive composition having high sensitivity to a ray of the 400 to 1,000 nm region is contained in the scope of the present invention:

(i) a photopolymerizable compound containing an addition-polymerizable unsaturated bond,
(ii) an organic linear polymer,
(iii) a photopolymerization initiator, and
(iv) a sensitizer which can absorb a radiation of 400 to 1,000 nm, preferably 400 to 750 nm, and can spectrally sensitize the above-mentioned initiators (iii).

Each component of the photopolymerizable composition usable in the present invention is described below in detail.

The photopolymerizable compound containing an addition-polymerizable unsaturated bond [component (i)] is selected from compounds containing at least one, preferably two, terminal ethylenic unsaturated bond(s). For example, they are compounds having chemical forms such as monomers, prepolymers like dimers, trimers, or oligomers, mixtures thereof, and copolymers thereof. Examples of the monomers and the copolymers thereof include esters of unsaturated carboxylic acids (for example, acrylic acid, methacrylic acid, itaconic acid, crotonic acid, isocrotonic acid, maleic acid) and aliphatic polyhydric alcohols; and amides of the unsaturated carboxylic acids and aliphatic polyhydric amine compounds.

Examples of the ester monomers of aliphatic polyhydric alcohols and unsaturated carboxylic acids include:

acrylic esters such as ethylene glycol diacrylate, triethylene glycol diacrylate, 1,3-butanediol diacrylate, tetramethylene glycol diacrylate, propylene glycol diacrylate, neopentyl glycol diacrylate, trimethylolpropane triacrylate, trimethylol-propane tri(acryloyloxypropyl) ether, trimethylolethane triacrylate, hexanediol diacrylate, 1,4-cyclohexanediol diacrylate, tetraethylene glycol diacrylate, pentaerythritol diacrylate, pentaerythritol triacrylate, pentaerythritol tetraacrylate, dipentaerythritol diacrylate, dipentaerythritol hexaacrylate, sorbitol triacrylate, sorbitol tetraacrylate, sorbitol pentaacrylate, sorbitol hexaacrylate, tri(acryloyloxyethyl) isocyanurate, and polyester acrylate oligomers;

methacrylic esters such as tetramethylene glycol dimethacrylate, triethylene glycol dimethacrylate, neopentyl glycol dimethacrylate, trimethylolpropane trimethacrylate, trimethylolethane trimethacrylate, ethylene glycol dimethacrylate, 1,3-butanediol dimethacrylate, hexanediol dimethacrylate, pentaerythritol dimethacrylate, pentaerythritol trimethacrylate, pentaerythritol tetramethacrylate, dipentaerythritol dimethacrylate, dipentaerythritol hexamethacrylate, sorbitol trimethacrylate, sorbitol tetramethacrylate, bis[p-(3-methacryloxy-2-hydroxypropoxy)phenyl] dimethylmethane, and bis[p-(acryloxyethoxy)phenyl] dimethylmethane;

itaconic esters such as ethylene glycol diitaconate, propylene glycol diitaconate, 1,3-butanediol diitaconate, 1,4-butanediol diitaconate, tetramethylene glycol diitaconate, pentaerythritol diitaconate, and sorbitol tetraitaconate;

crotonic esters such as ethylene glycol dicrotonate, tetramethylene glycol dicrotonate, pentaerythritol dicrotonate, and sorbitol tetracrotonate;

isocrotonic esters such as ethylene glycol diisocrotonate, pentaerythritol diisocrotonate, and sorbitol tetraisocrotonate;

maleic esters such as ethylene glycol dimaleate, triethylene glycol dimaleate, pentaerythritol dimaleate, and sorbitol tetramaleate; and mixtures thereof.

Examples of the amide monomers of the unsaturated carboxylic acids and aliphatic polyamine compounds include methylene bis(acrylamide), methylene bis (methacrylamide), 1,6-hexamethylene bis(acrylamide), 1,6-hexamethylene bis(methacrylamide), diethylenetriamine tris (acrylamide), xylylene bis(acrylamide), and xylylene bis (methacrylamide).

An example of other monomers usable for this purpose is vinylurethane compounds containing two or more polymerizable vinyl groups in molecule which are prepared by an addition reaction of a polyisocyanate compound containing two or more isocyanate groups in molecule and a vinyl monomer containing a hydroxyl group represented by the following formula (A), as described in JP-B-48-41708:

$$CH_2=C(R)COOCH_2CH(R')OH \quad (A)$$

wherein R and R' each represents H or $CH_3$.

The other usable polymerizable compounds containing an addition-polymerizable unsaturated bond are polyfunctional acrylates and methacrylates such as urethane acrylates as described in JP-A-51-37193; polyester acrylates as described in JP-A-48-64183, JP-B-49-43191 and JP-B-52-30490; and epoxy acrylates prepared by a reaction of an epoxy resin with an acrylate or methacrylate. Further, photocurable monomers and oligomers described in *Nippon Secchaku Kyokai-shi*, vol. 20, No. 7, pp. 300–308 (1984) can also be used for this purpose. The amount of these polymerizable compounds is generally from 5 to 50% by weight (hereinafter merely abbreviated as "%"), preferably from 10 to 40%, per amount of all components.

Any organic linear polymer can be used as the organic linear polymer [component (ii)] in the present invention, as long as it is compatible with photopolymerizable compounds containing an addition-polymerizable unsaturated bond [component (i)]. Organic linear polymers containing a group from which hydrogen is easily eliminated by a sulfur radical are preferably selected as component (ii), and water-soluble or aqueous weak alkali-soluble, or water-swelling or aqueous weak alkali-swelling organic linear polymers are preferably used, which makes it possible to develop the resulting PS plates with water or an aqueous solution of a weak alkali. The organic linear polymers function as film formers in the composition, and are selected depending upon the kind of developers such as water, aqueous weak alkalis and organic solvents. For example, use of a water-soluble organic linear polymer enables the resulting PS plate to be developed with water. Examples of the organic linear polymers include addition polymers containing a carboxyl group at the side chains such as methacrylic acid copolymers, acrylic acid copolymers, itaconic acid copolymers, crotonic acid copolymers, maleic acid copolymers, and partially esterified maleic acid copolymers, as described in JP-A-59-44615, JP-B-54-34327, JP-B-58-12577, JP-B-54-25957, JP-A-54-92723, JP-A-59-53836, and JP-A-59-71048. Acidic cellulose derivatives containing a carboxyl group at the side chain can also be used. Other useful organic linear polymers are products prepared by addition of cyclic anhydrides to addition polymers containing a hydroxyl group. Benzyl (meth)acrylate/(meth) acrylic acid/other addition-polymerizable vinyl monomers (added as needed) copolymers and allyl (meth)acrylate/(meth)acrylic acid/other addition-polymerizable vinyl monomers (added as needed) copolymers are appropriately used as the organic linear polymers. In addition, polyvinyl pyrrolidone, polyethylene oxide, and so forth are useful as water-soluble organic linear polymers. Alcohol-soluble nylons and polyethers from 2,2-bis(4-hydroxyphenyl)propane and epichlorohydrin are also useful to increase the strength of a cured film.

The organic linear polymers [component (ii)] contain a group from which hydrogen is easily eliminated preferably by a sulfur radical, a group from which hydrogen is more easily eliminated than from the methyl group of toluene by a methyl radical, and more preferably $R^{10}R^{11}C=CH—CHR^{12}—$, $—CHR^{13}Ar_1$,

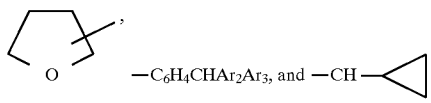

wherein $R^{10}$, $R^{11}$, $R^{12}$, and $R^{13}$ each represents a hydrogen atom, an alkyl group, an alkenyl group, or an aryl group which may be substituted; and $Ar_1$, $Ar_2$ and $Ar_3$ each represents an aryl group which may be substituted.

These organic linear polymers can be mixed in an appropriate amount in the composition. However, an amount thereof exceeding 90%, based on the total weight of the composition except for the weight of solvent, fails to offer a good effect on the strength of images formed. Therefore, the content of the organic linear polymers is generally from 20 to 90%, and preferably from 30 to 80%. The weight ratio of the photopolymerizable ethylenic unsaturated compounds [component (i)] to the organic linear polymers [component (ii)] is generally from 1/9 to 7/3, and preferably from 3/7 to 5/5.

Examples of the photopolymerization initiators [component (iii)] usable in the present invention include benzil, benzoin, benzoin ether, Michler's ketone, anthraquinone, acridine, phenazine, benzophenone, 2-ethylanthraquinone, trihalomethyltriazine, and ketoxime esters; photo-reductive dyes such as Rose Bengale, Eosine and erythrosine which are described in U.S. Pat. No. 2,850,445; combinations of dyes with initiators such as composite initiating systems consisting of dyes and amines as described in JP-B-44-20189; systems consisting of hexaarylbiimidazoles, radical formers and dyes as described in JP-B-45-37377; systems consisting of hexaarylbiimidazoles and p-dialkylaminobenzylidene ketones as described in JP-B-47-2528 and JP-A-54-155292; systems consisting of dyes and organic peroxides as described in JP-B-62-1641, JP-A-59-1504, JP-A-59-140203, JP-A-59-189340, U.S. Pat. No. 4,766,055, and JP-A-62-174203; systems consisting of dyes and active halogen compounds as described in JP-A-54-15102, JP-A-58-15503, JP-A-63-178105, JP-A-63-258903, and JP-A-2-63054; and systems consisting of dyes and borate compounds as described in JP-A-62-143044, JP-A-62-150242, JP-A-64-13140, JP-A-64-13141, JP-A-64-13142, JP-A-64-13143, JP-A-64-13144, JP-A-64-17048, JP-A-64-72150, JP-A-1-229003, JP-A-1-298348, JP-A-1-138204, JP-A-2-179643, and JP-A-2-244050.

Examples of the above-mentioned hexaarylbiimidazoles include 2,2'-bis(o-chlorophenyl)-4,4',5,5'-tetraphenyl-biimidazole, 2,2'-bis(o-bromophenyl)-4,4',5,5'-tetraphenyl-biimidazole, 2,2'-bis(o,p-dichlorophenyl)-4,4',5,5'-tetraphenylbiimidazole, 2,2'-bis(o-chlorophenyl)-4,4',5,5'-tetra(m-methoxyphenyl)biimidazole, 2,2'-bis(o,o'-dichlorophenyl)-4,4',5,5'-tetraphenylbiimidazole, 2,2'-bis(o-nitrophenyl)-4,4',5,5'-tetraphenylbiimidazole, 2,2'-bis(o-methylphenyl)-4,4',5,5'-tetraphenylbiimidazole, and 2,2'-bis(o-trifluoromethylphenyl)-4,4',5,5'-tetraphenyl-biimidazole. Examples of the ketoxime esters include 3-benzoyloxyiminobutan-2-one, 3-acetoxyiminobutan-2- one, 3-propionyloxyiminobutan-2-one, 2-acetoxyiminopentan-3-one, 2-acetoxyimino-1-phenylpropan-1-one, 2-benzoyloxyimino-1-phenylpropan-1-one, 3-p-toluene-sulfonyloxyiminobutan-2-one, and 2-ethoxycarbonyloxyimino-1-phenylpropan-1-one.

The sensitizers [component (iv)] used preferably in the present invention include cyanine dyes, merocyanine dyes, (keto)coumarin dyes, (thio)xanthene dyes, acridine dyes, thiazole dyes, thiazine dyes, oxazine dyes, azine dyes, aminoketone dyes, squarylium dyes, pyridinium dyes, (thia) pyrylium dyes, porphyrin dyes, triarylmethane dyes, (poly) methine dyes, aminostyryl compounds, and polynuclear aromatic hydrocarbons. Among these, sensitizers used preferably are cyanine dyes, merocyanine dyes, (keto)coumarin dyes, (thio)xanthene dyes, (poly)methine dyes, and aminostyryl compounds.

Examples of the cyanine dyes are described in JP-A-64-13140; examples of the merocyanine dyes in JP-A-59-89303, JP-A-2-244050 and JP-A-2-179643; examples of the (keto)coumarin dyes in *Polymer. Eng. Sci.*, 23, 1022 (1983) and JP-A-63-178105; examples of the (thio)xanthene dyes in JP-A-64-13140 and JP-A-1-126302; examples of (poly) methine dyes in JP-A-5-5988, JP-A-5-72732, and JP-A-5-107758; and examples of the aminostyryl compounds in JP-A-55-50001, JP-A-2-69, JP-A-2-63053, and JP-A-2-229802.

The above-mentioned compounds [component (iv)] which can absorb a ray in the 400 to 1,000 nm region and spectrally sensitize the photopolymerization initiators are preferably used, singly or as a mixture in the photopolymerizable photosensitive composition of the present invention. The compounds [component (iv)] which can absorb a ray in the 400 to 750 nm region and spectrally sensitize the photo-polymerization initiators are more preferably used. Examples of the compounds used more preferably are described below.

The cyanine dyes represented by the following formula are particularly useful:

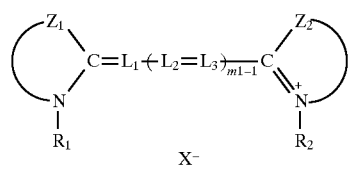

In the above formula, $Z_1$ and $Z_2$ each represents a group of atoms necessary for forming a heterocyclic nucleus which is generally used as a cyanine dye, such as a thiazole nucleus, a thiazoline nucleus, a benzothiazole nucleus, a naphthothiazole nucleus, an oxazole nucleus, an oxazoline nucleus, a benzoxazole nucleus, a naphthoxazole nucleus, a tetrazole nucleus, a pyridine nucleus, a quinoline nucleus, an imidazoline nucleus, an imidazole nucleus, a benzimidazole nucleus, a naphthoimidazole nucleus, a selenazoline nucleus, a selenazole nucleus, a benzoselenazole nucleus, a naphthoselenazole nucleus, and an indolenine nucleus. These nuclei may be substituted with a lower alkyl group such as a methyl group, a halogen atom, a phenyl group, a hydroxyl group, an alkoxy group having 1 to 4 carbon atoms, a carboxyl group, an alkoxycarbonyl group, an alkylsulfamoyl group, an alkylcarbamoyl group, an acetyl group, an acetoxy group, a cyano group, a trichloromethyl group, a trifluoromethyl group, or a nitro group.

$L_1$, $L_2$ and $L_3$ each represents a methine group or a substituted methine group. Examples of substituent groups for the substituted methine group include a lower alkyl group such as a methyl group and an ethyl group, a phenyl group, a substituted phenyl group, a methoxy group, an ethoxy group, aralkyl groups such as a phenethyl group. $L_1$ and $R_1$, and $L_3$ and $R_2$, and $L_2$ and $L_3$ when $m_1$ is 3, each may form a 5- or 6-membered ring which is cross-linked by an alkylene group.

$R_1$ and $R_2$ each represents a lower alkyl group (preferably having 1 to 8 carbon atoms); an alkyl group substituted with a carboxyl group, a sulfo group, a hydroxyl group, a halogen atom, an alkoxy group having 1 to 4 carbon atoms, a phenyl group, or a substituted phenyl group (the alkylene moiety having preferably 1 to 5 carbon atoms) such as β-sulfoethyl, γ-sulfopropyl, γ-sulfobutyl, δ-sulfobutyl, 2-[2-(3-sulfopropoxy)ethoxy]ethyl, 2-hydroxysulfopropyl, 2-chlorosulfopropyl, 2-methoxyethyl, 2-hydroxyethyl, carboxymethyl, 2-carboxyethyl, 2,2,3,3'-tetrafluoropropyl, and 3,3,3-trifluoroethyl); an allyl group; and other substituted alkyl groups usually used as N-substituent groups in the cyanine dyes. $m_1$ represents 1, 2, or 3. $X^-$ represents a halogen ion.

The cyanine dyes used most preferably are as follows:

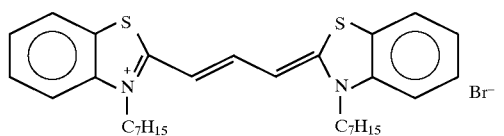

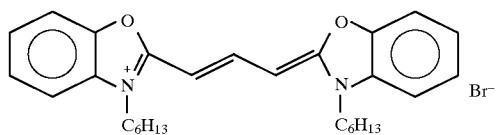

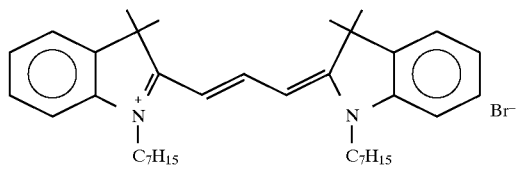

The merocyanine dyes represented by the following formula is particularly useful:

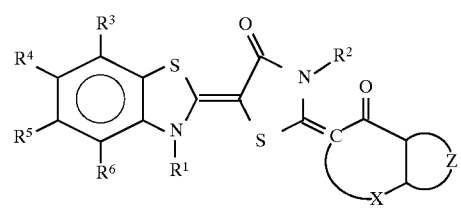

wherein $R^1$ and $R^2$ each represents a hydrogen atom, an alkyl group, a substituted alkyl group, an alkoxyl group, an alkoxycarbonyl group, an aryl group, a substituted aryl group, or an aralkyl group; $R^3$, $R^4$, $R^5$, and $R^6$ each represents the same groups as those defined as $R^1$ and $R^2$, an alkylthio group, an arylthio group, an amino group, or a substituted amino group; X represents a group of nonmetallic atoms necessary for forming a 5- to 7-membered ring; and Z represents a group of nonmetallic atoms necessary for forming a substituted or unsubstituted aromatic ring or a substituted or unsubstituted heteroaromatic ring.

Among these, a merocyanine dye used most preferably is as follows:

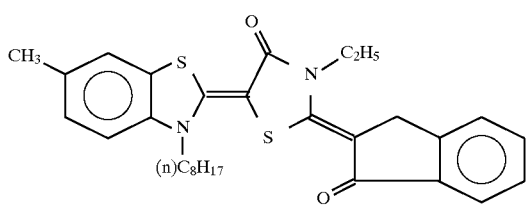

Furthermore, the merocyanine dyes represented by the following formula also are particularly useful:

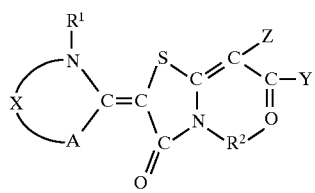

wherein $R_1$ and $R_2$ each represents a hydrogen atom, an alkyl group, a substituted alkyl group, an alkoxycarbonyl group, an aryl group, a substituted aryl group, or an aralkyl group; A represents an oxygen atom, a sulfur atom, a selenium atom, a tellurium atom, a nitrogen atom substituted with an alkyl group or an aryl group, or a carbon atom substituted with two alkyl groups; X represents a group of nonmetallic atoms necessary for forming a nitrogen-containing 5-membered heterocycle; Y represents a substituted phenyl group, a unsubstituted or substituted polynuclear aromatic ring, or a unsubstituted or substituted heteroaromatic ring; and Z represents a hydrogen atom, an alkyl group, a substituted alkyl group, an aryl group, a substituted aryl group, an aralkyl group, an alkoxy group, an alkylthio group, an arylthio group, a substituted amino group, an acyl group, or an alkoxycarbonyl group, or Z may combine with Y to form a ring.

Among these, the following merocyanine dyes are most preferably used.

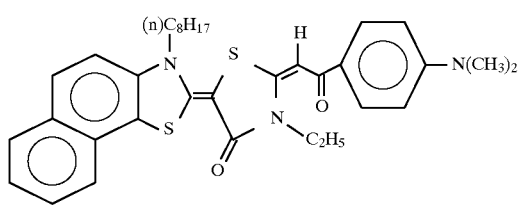

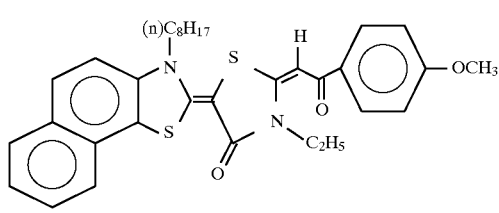

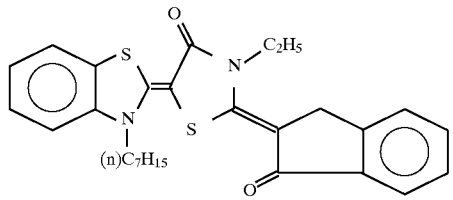

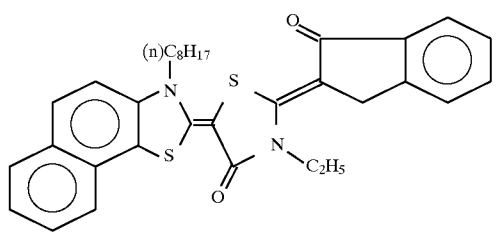

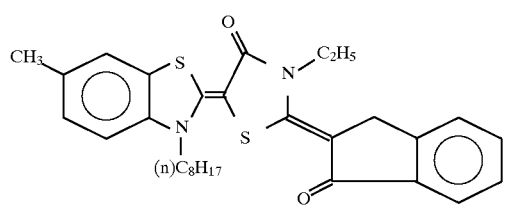

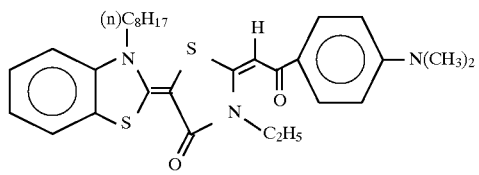

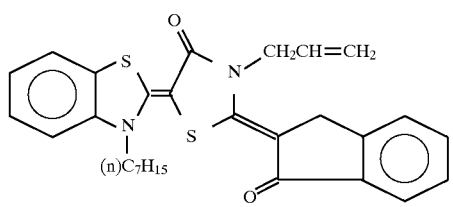

The (keto)coumarin dyes represented by the following formula are particularly useful.

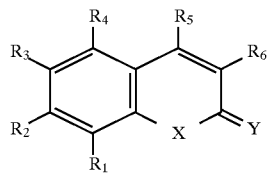

In the above formula, $R_1$ to $R_4$ each represents a hydrogen atom, a halogen atom, an alkyl group, a substituted alkyl group, an aryl group, a substituted aryl group, a hydroxyl group, an alkoxy group, a substituted alkoxy group, an amino group, or a substituted amino group. Two adjacent groups of $R_1$ to $R_4$ may combine with each other to form a ring consisting of nonmetallic atoms together with the carbon atoms to which the two adjacent groups of $R_1$ to $R_4$ attach.

$R_5$ represents a hydrogen atom, an alkyl group, a substituted alkyl group, an aryl group, a substituted aryl group, a heteroaromatic group, a substituted heteroaromatic group, a cyano group, an alkoxy group, a substituted alkoxy group, a carboxyl group, an alkenyl group, or a substituted alkenyl group.

$R_6$ represents $R_7$ or —Z—$R_7$ wherein $R_7$ is selected from among the groups defined as $R_5$; and Z represents a carbonyl group, a sulfonyl group, a sulfinyl group, or an allylene-dicarbonyl group. $R_5$ and $R_6$ may combine with each other to form a ring consisting of nonmetallic atoms.

X represents O, S, NH, or a nitrogen atom having a substituent.

Y represents an oxygen atom or $=CG_1G_2$ wherein $G_1$ and $G_2$ may be the same or different, and each represents a hydrogen atom, a cyano group, an alkoxycarbonyl group, a substituted alkoxycarbonyl group, an aryloxycarbonyl group, a substituted aryloxycarbonyl group, an acyl group, a substituted acyl group, an arylcarbonyl group, a substituted arylcarbonyl group, an alkylthio group, an arylthio group, an alkylsulfonyl group, an arylsulfonyl group, or a fluorosulfonyl group, with the proviso that $G_1$ and $G_2$ cannot be hydrogen atoms at the same time; $G_1$ and $G_2$ may combine with each other to form a ring consisting of nonmetallic atoms together with the carbon atom to which $G_1$ and $G_2$ attach. Among these, (keto)coumarin dyes used preferably are as follows:

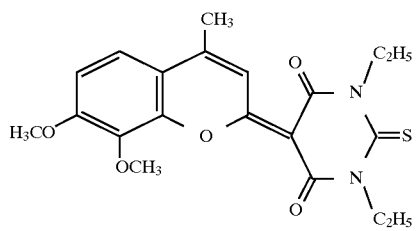

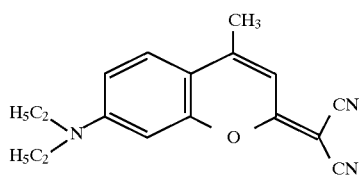

-continued

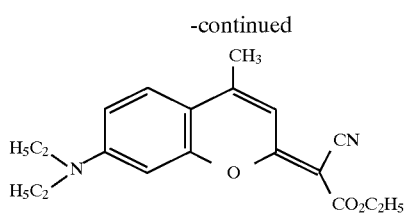

The xanthene dyes represented by the following formula are particularly useful:

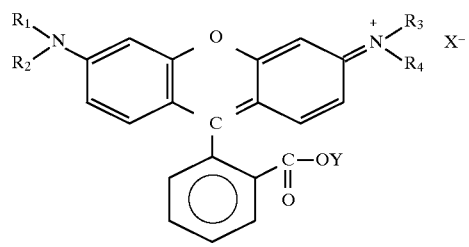

wherein $R_1$, $R_2$, $R_3$, and $R_4$ each represents a hydrogen atom, an alkyl group having 1 to 6 carbon atoms, or an aryl group; X represents a halogen ion; Y represents an alkyl group, an aryl group, a hydrogen atom, or an alkali metal. Among these, xanthene dyes used preferably are as follows:

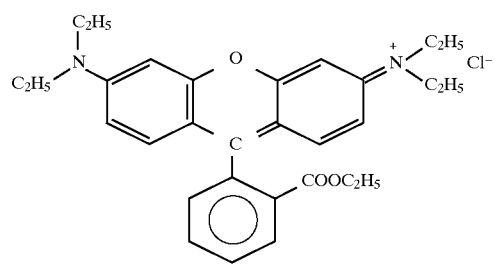

The (poly)methine dyes represented by the following formula are particularly useful:

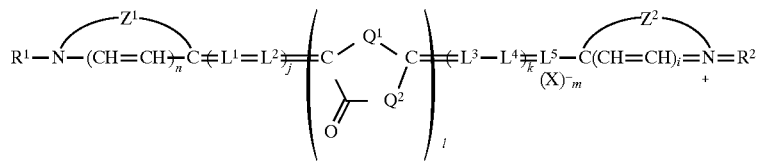

wherein $Z^1$ and $Z^2$ each represents a group of nonmetallic atoms necessary for forming a 5- or 6-membered nitrogen-containing heterocycle which is usually contained in cyanine dyes; $R^1$ and $R^2$ each represents an alkyl group; $Q^1$ and $Q^2$ represent a group of atoms necessary for forming, by a combination with each other, a 4-thiazolidinone ring, a 5-thiazolidinone ring, a 4-imidazolidinone ring, a 4-oxazolidinone ring, 5-oxazolidinone, a 5-imidazolidinone ring, or a 4-dithiolanone ring; $L^1$, $L^2$, $L^3$, $L^4$, and $L^5$ each represents a methine group; m represents 1 or 2; i and h each represents 0 or 1; l represents 1 or 2; j and k each represents 0, 1, 2, or 3; $X^-$ represents a counter ion. Among these, the poly)methine dyes used preferably are as follows:

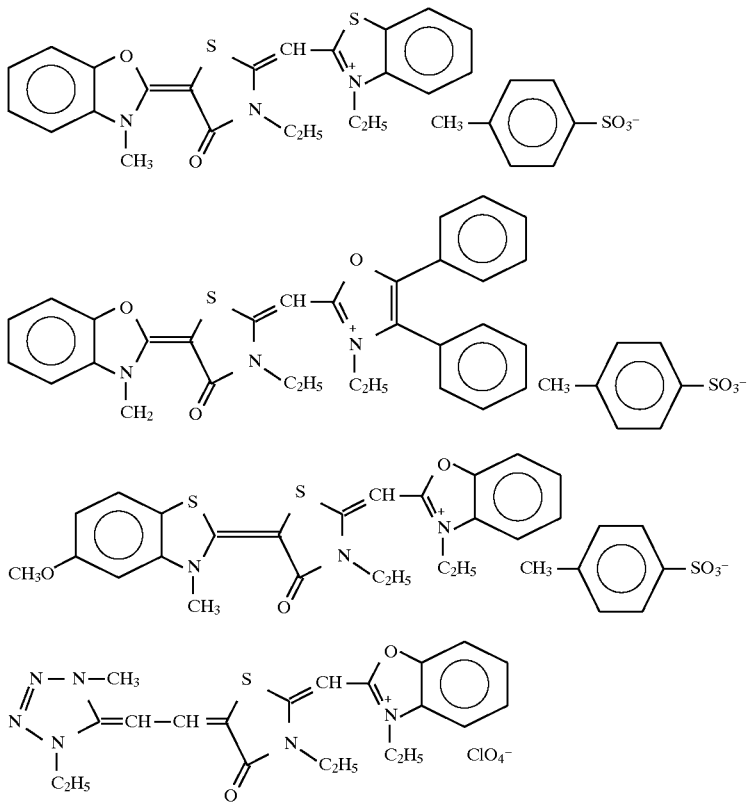

The aminostyryl compounds represented by the following formula are particularly useful:

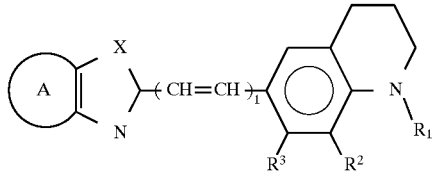

wherein ring A represents a benzene ring or a naphthalene ring which may be substituted; X represents a divalent atom or a divalent group; $R^1$ represents an alkyl group, $R^2$ and $R^3$ each represents a hydrogen atom, an alkyl group, an alkoxyl group, or an alkylthio group, and $R^1$ and $R^2$ may combine with each other to form a ring; and l represents 0, 1, or 2.

Among these, the aminostyryl compounds used most preferably are as follows:

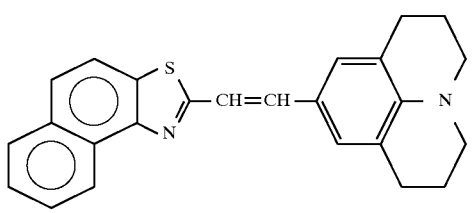

-continued

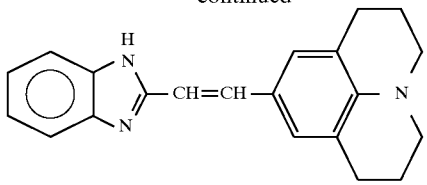

The laser beam-exposable, photopolymerizable compositions can contain compounds (v) selected from the group consisting of the following (a), (b) and (c).

(a) Compounds Containing an $R^1R^2N$— Group $R^1$ and $R^2$ each represents a hydrogen atom, an alkyl group having 1 to 18 carbon atoms, or an alkyl group having 1 to 18 carbon atom substituted with —$OR^3$, —CO—$R^3$, —CO—$C_6H_4$—$(B)_n$, —$COOR^3$, —NH—CO—$R^3$, —NH—CO—$C_6H_4$—$(B)_n$, —$(CH_2CH_2O)_m$—$R^3$, or a halogen atom (F, Cl, Br, I). Further, $R^1$ and $R^2$ may combine with each other to form a heterocycle together with the nitrogen atom to which $R^1$ and $R^2$ attach. $R^3$ represents a hydrogen atom or an alkyl group having 1 to 10 carbon atoms. B represents a dialkylamino group, a hydroxyl group, an acyloxy group, a halogen atom, or a nitro group. n represents an integer of 0 to 4, and m an integer of 1 to 20.

(b) Thio Compounds Represented by the Following Formula (5)

In the above formula (5), $R^4$ represents an alkyl group, a substituted alkyl group, an aryl group, or a substituted aryl group. $R^5$ represents a hydrogen atom, an alkyl group, or a substituted alkyl group. Further, $R^4$ and $R^5$ may represent a group of nonmetallic atoms necessary for forming, by a combination with each other, a 5-, 6-, or 7-membered ring which may contain a heteroatom selected from the group consisting of an oxygen atom, a sulfur atom and a nitrogen atom.

(c) Compounds Represented by the Following Formula (6)

In the above formula, $R^6$, $R^7$, $R^8$, and $R^9$ may be the same or different, and they each represent a substituted or unsubstituted alkyl group, a substituted or unsubstituted aryl group, a substituted or unsubstituted alkenyl group, a substituted or unsubstituted alkynyl group, or a substituted or unsubstituted heterocyclic group. Two or more groups of $R^6$, $R^7$, $R^8$, and $R^9$ may combine with each other to form a ring structure, with the proviso that at least one of $R^6$, $R^7$, $R^8$, and $R^9$ is an alkyl group. $Z^+$ represents an alkali-metal cation or a quaternary ammonium cation.

Compounds containing an $R^1R^2N$— group (a) usable for the present invention include various kinds of amines, examples of which are as follows:

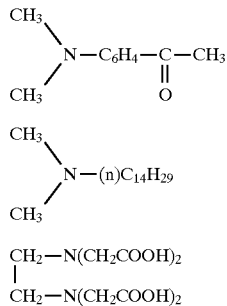

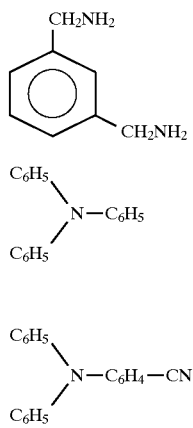

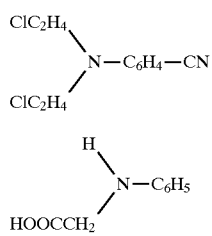

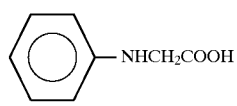

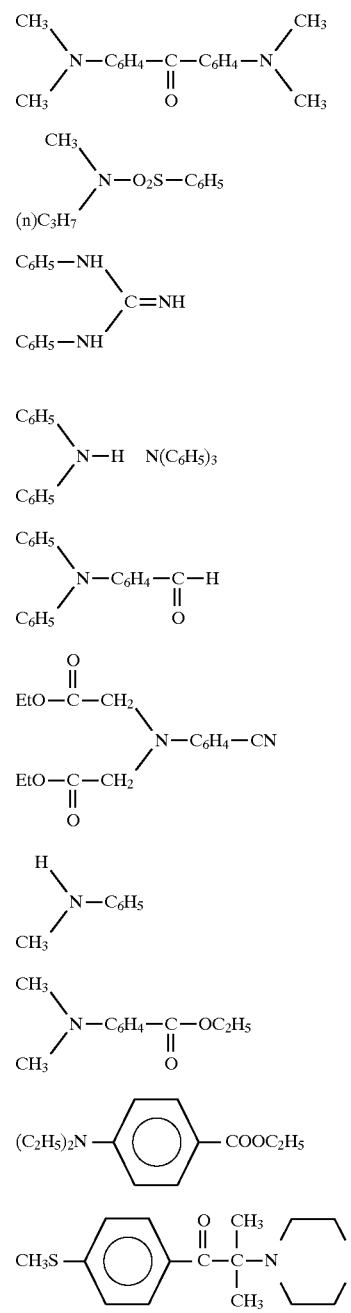

-continued

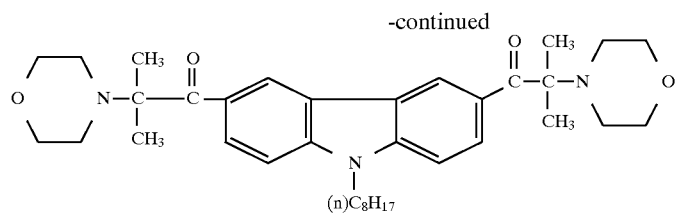

Examples of thio compounds (b) represented by formula (5) include compounds containing groups $R^4$ and $R^5$ shown in Table 1. In compounds 15 to 46, $R^4$ and $R^5$ each represents a group formed by a combination with each other.

TABLE 1

| Compound No. | $R^4$ | $R^5$ |
|---|---|---|
| 1 | —H | —H |
| 2 | —H | —CH₃ |
| 3 | —CH₃ | —H |
| 4 | —CH₃ | —CH₃ |
| 5 | —C₆H₅ | —C₂H₅ |
| 6 | —C₆H₅ | —C₄H₉ |
| 7 | —C₆H₄Cl | —CH₃ |
| 8 | —C₆H₄Cl | —C₄H₉ |
| 9 | —C₆H₄—CH₃ | —C₄H₉ |
| 10 | —C₆H₄—OCH₃ | —CH₃ |
| 11 | —C₆H₄—OCH₃ | —C₂H₅ |
| 12 | —C₆H₄—OC₂H₅ | —CH₃ |
| 13 | —C₆H₄—OC₂H₅ | —C₂H₅ |
| 14 | —C₆H₄—OCH₃ | —C₄H₉ |
| 15 | —(CH₂)₃— | |
| 16 | —(CH₂)₂—S— | |
| 17 | —CH(CH₃)—CH₂—S— | |
| 18 | —CH₂—CH(CH₃)—S— | |
| 19 | —C(CH₃)₂—CH₂—S— | |
| 20 | —CH₂—C(CH₃)₂—S— | |
| 21 | —(CH₂)₂—O— | |
| 22 | —CH(CH₃)—CH₂—O— | |
| 23 | —C(CH₃)₂—CH₂—O— | |
| 24 | —CH=CH—N(CH₃)— | |
| 25 | —(CH₂)₃—S— | |
| 26 | —(CH₂)₂CH(CH₃)—S— | |
| 27 | —(CH₂)₃O— | |
| 28 | —(CH₂)₅— | |
| 29 | —C₆H₄—O— | |
| 30 | —N=C(SCH₃)—S— | |
| 31 | —C₆H₄—NH— | |
| 32 | —C₆H₄—NC₂H₅— | |
| 33 | (1) | |
| 34 | (2) | |
| 35 | (3) | |
| 36 | (4) | |
| 37 | (5) | |
| 38 | (6) | |
| 39 | (7) | |
| 40 | (8) | |
| 41 | (9) | |
| 42 | (10) | |
| 43 | (11) | |
| 44 | (12) | |
| 45 | (13) | |
| 46 | (14) | |

In compounds 33 to 46 shown in the table 1, groups formed by a combination of $R^4$ and $R^5$ are as follows:

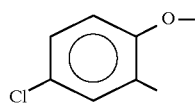  (1)

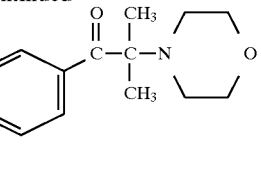

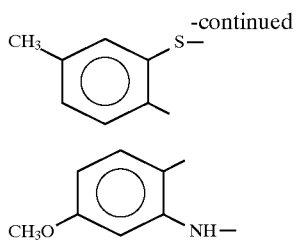

Examples of compounds (c) represented by formula (6) are described in JP-A-2-179643.

The photopolymerization initiators [component (iii)] usable in the present invention are usually used in very low concentration. Too high concentration of the initiators has an adverse effect on the resulting PS plates and, for example, causes effective rays to be shielded. In the present invention, the amount of the photopolymerization initiators is generally from 0.01 to 60%, preferably from 1 to 30%, based on the total amount of the polymerizable compounds [component (i)] and the organic linear polymers [component (ii)].

The ratio of the photopolymerization initiators [component (iii)] to the sensitizers [component (iv)] is generally from 0.05 to 30 parts by weight, preferably from 0.1 to 10 parts by weight, and more preferably from 0.2 to 5 parts by weight, per part by weight of the sensitizers [component (iv)].

When compound (v) selected from the group consisting of the compounds described in (a) to (c) is added to the composition, the amount thereof is generally from 0.05 to 50 parts by weight, preferably from 0.1 to 30 parts by weight, and more preferably from 0.2 to 10 parts by weight, per part by weight of the photopolymerization initiator [component (iii)].

In addition to the above-mentioned fundamental components, a small amount of a heat polymerization inhibitor is preferably added to the photopolymerizable photosensitive composition of the present invention to inhibit undesired heat polymerization of the photopolymerizable compounds [component (i)] during the manufacturing process or storage of the photosensitive composition. Examples of the heat polymerization inhibitors used preferably include hydroquinone, p-methoxyphenol, di-t-butyl-p-cresol, pyrogallol, t-butylcatechol, benzoquinone, 4,4'-thiobis(3-methyl-6-t-butylphenol), 2,2'-methylenebis(4-methyl-6-t-butylphenol), N-nitroso-phenylhydroxylamine primary cerium salt, and N-nitroso-phenylhydroxylamine aluminum salt. The content of the heat polymerization inhibitors is generally from 0.001 to 10%, preferably from 0.01 to 5%, based on the weight of the whole composition. To avoid the hindrance to polymerization caused by oxygen, higher fatty acid derivatives such as behenic acid and behenic acid amide may be added and distributed only on the external layer of the photosensitive layer during drying process after coating. The content of the higher fatty acid derivatives in the whole composition is generally from about 0.1 to about 20%, preferably from 0.5 to 10%. Further, to color the photosensitive layer, dyes or pigments may be added to the composition. The content of the dyes or pigments in the whole composition is generally from 0.1 to 10%, preferably from 0.5 to 5%. In addition, to improve the properties of a cured film, inorganic fillers or other known additives may be added to the composition.

The photopolymerizable composition of the present invention is dissolved in various organic solvents prior to its application to a support. Examples of the solvents used for this purpose include acetone, methyl ethyl ketone, cyclohexane, ethyl acetate, ethylene dichloride, tetrahydrofuran, toluene, ethylene glycol monomethyl ether, ethylene glycol monoethyl ether, ethylene glycol dimethyl ether, propylene glycol monomethyl ether, propylene glycol monoethyl ether, acetylacetone, cyclohexanone, diacetone alcohol, ethylene glycol monomethyl ether acetate, ethylene glycol ethyl ether acetate, ethylene glycol monoisopropyl ether, ethylene glycol monobutyl ether acetate, 3-methoxypropanol, methoxymethoxy-ethanol, diethylene glycol monomethyl ether, diethylene glycol monoethyl ether, diethylene glycol dimethyl ether, diethylene glycol diethyl ether, propylene glycol monomethyl ether acetate, propylene glycol monoethyl ether acetate, 3-methoxypropyl acetate, N,N-dimethylformamide, dimethyl sulfoxide, γ-butyrolactone, methyl lactate, and ethyl lactate. These solvents can be used singly or as a mixture thereof. The content of solid components in the coating solution is generally from 2 to 50%, and preferably from 5 to 30%.

The coating weight after drying is from 0.1 to 10 g/m$^2$, and preferably from 0.5 to 5 g/m$^2$.

In the present invention, an organic underlayer can be provided, as needed, before the photopolymerizable photosensitive layer is formed on the addition-reactive support which is prepared by implanting the radical addition-reactive functional groups on the support by a covalent bond.

Examples of organic compounds used for this organic underlayer include carboxymethyl cellulose; dextrin; gum arabic; phosphonic acids containing an amino group such as 2-aminoethylphosphonic acid, organic phosphonic acids such as phenylphosphonic acid, naphthylphosphonic acid, alkyl-phosphonic acid, glycerophosphonic acid, methylenediphosphonic acid, and ethylenediphosphonic acid which may be substituted; organic phosphoric acids such as phenylphosphoric acid, naphthylphosphoric acid, alkyl-phosphoric acid, and glycerophosphoric acid; organic phosphinic acids such as phenylphosphinic acid, naphthylphosphinic acid, alkylphosphinic acid, and glycerophosphinic acid which may be substituted; amino acids such as glycine and β-alanine; and hydroxyl group-containing amine hydrochlorides such as triethanolamine hydrochloride. These acids may be used singly or as a mixture of two or more kinds thereof.

The organic underlayer can be provided according to the following methods. That is, in one of the methods, the above-mentioned organic compounds are dissolved in water, an organic solvent such as methanol, ethanol, methyl ethyl ketone, or a mixture thereof, applied to an aluminum plate, and then dried. In another method, the organic compounds are dissolved in water, an organic solvent such as methanol, ethanol, methyl ethyl ketone, or a mixture thereof, absorbed by an aluminum plate by dipping it into the resulting solution, washed with water or others, and then dried. In the former method, the solutions of the organic compounds are applied in concentration of 0.005 to 10% by weight according to various methods of coating such as bar coater coating, rotary coating, spray coating, and curtain coating. In the latter method, the concentration of the solutions is from 0.01 to 20% by weight, and preferably from 0.05 to 5% by weight; the dipping temperature is from 20° to 90° C., and preferably from 25° to 50° C.; and the dipping time is from 0.1 sec to 20 min, and preferably from 2 sec to 1 min.

The solutions used for this purpose may be adjusted to pH 1 to 12 with a basic substance such as ammonia, triethylamine and potassium hydroxide or with an acidic substance such as hydrochloric acid and phosphoric acid. Further, to improve the tone reproducibility of the photosensitive lithographic printing plate, a yellow dye may also be added to the composition.

The coating weight of the organic underlayer is suitably from 2 to 200 mg/m² after drying.

A covering layer formed of an organic polymer (hereinafter referred to as a "back coat layer") may be formed on the back surface of a support, as needed, to prevent the photosensitive layer from being impaired by the back surface of a superposed photosensitive printing forme, when the printing formes (PS plates) are piled. Main components used for the back coat layer are at least one of resins having a glass transition point of 20° C. or higher which are selected from the group consisting of saturated polyester copolymer resins, phenoxy resins, polyvinyl acetal resins, and vinylidene chloride copolymer resins.

Additives which may be further added to the back coat layer are dyes or pigments for coloring, wax used usually as a lubricant, higher fatty acids, higher fatty acid amides, silicone compounds comprising a dimethylsiloxane structure, modified dimethylsiloxanes, powdered polyethylene and so forth.

Various methods can be applied to cover the back surface of an aluminum support with the back coat layer. There are, for example, a method in which components forming the layer are dissolved in a suitable solvent to prepare a solution or an emulsified dispersion, coated, and then dried; a method in which a film previously formed of the components is laminated with an aluminum plate by an adhesive or by heat; and a method in which a melt film extruded from an extruder is directly laminated with a support.

It is described in EP-A-0490515 that, when the photosensitive lithographic printing plate is subjected to development, an oxide layer of an anodized aluminum plate is dissolved in an large amount out of the back surface at the side opposite to the photosensitive layer of the aluminum support to cause the formation of insoluble matter. The formation of insoluble matter makes it difficult to steadily treat a large number of the photosensitive lithographic printing plates over a long period of time using an automatic processor.

In the present invention, a back coat layer having excellent resistance to a developer can be formed on the back surface of the photosensitive lithographic printing plate to make it possible to control the formation of such insoluble matter and to steadily treat without exchanging a developer in an automatic processor over a long period of time. In many cases, the covering layer formed of an organic polymer which is provided to prevent the photosensitive layer from being impaired simultaneously functions as a back coat layer for inhibiting the oxide layer of an anodized aluminum plate from dissolving out. However, when the swelling of the back coat layer during printing becomes an issue or when the back coat layer after development requires hydrophilicity, the back coat layer is preferably formed of a metal oxide having resistance to alkali according to a method described in JP-A-6-35174.

The metal oxides used for this purpose include silica (silicon dioxide), titanium oxide, boron oxide, zirconium oxide, and composites thereof.

These metal oxides can be applied as colloidal ones to the back surface of a support, and then dried. However, it is preferred that an organometallic compound or an inorganic salt having a hydrolyzable chemical form, which is used as a starting material, is subjected to hydrolysis and condensation polymerization in water or in an organic solvent in the presence of a catalyst such as an acid or base to prepare a sol, which is applied to the back surface of the support, and then dried. Examples of the organometallic compounds and hydrolyzable inorganic salts include metal alkoxides, acetylacetonatometal, metal acetates, metal oxalates, metal nitrates, and metal carbonates.

Thus, the present invention provides a PS plate which is prepared by implanting covalently a radical addition-reactive functional group on the surface of a support having a controlled surface roughness (Ra) of 0.60 μm or less followed by forming a highly sensitive photopolymerizable photosensitive layer on the surface, the layer containing a photopolymerization initiator and a sensitizer absorbing light in the 400 to 1,000 nm region. The printing plate which is obtained by exposing the PS plate thus prepared to a laser beam and subsequently developing can exhibit the maximum solid press life that the printing plate has, without deteriorating printing performance such as a highlight press life and resistance to stain. The solid press life means the maximum number of sheets printed normally without any spots. The highlight press life means the maximum number of printed sheets in which circular dots of several μm to scores μm in diameter or square dots of several μm to scores μm in side are reproduced. The maximum number of printed sheets is called a printable number of sheets. The printable number of sheets greatly varies depending upon the kind of printing machines or printing conditions. In addition to printing conditions such as the quantity of fountain solution and the temperature of a printing plate, which relate to the printing machines, the printable number of sheets varies with the kind of ink used, the kind of dampening solutions used, the kind of paper used. Therefore, a standard printing plate treated under standard conditions is used as a standard of the printable number of sheets, and relative values of other printing plates to the standard printing plate are generally shown as impression capacity thereof. The standard printing plate used in the present invention is PS plate FNSA manufactured by Fuji Photo Film Co., Ltd. which is image-exposed with PS Light manufactured by Fuji Photo Film Co., Ltd. from a distance of 1 m for 1 min using a negative film, and processed with the aid of automatic processor PS-800H manufactured by Fuji Photo Film Co., Ltd. using aqueous alkali developer DN-3C manufactured by the same corporation which is diluted twofold with tap water and gum solution FN-2 manufactured by the same corporation which is also diluted twofold with tap water.

The PS plate of the present invention, which allows images to be written with the aid of a laser, processed, and then used as a printing plate, exhibits an equivalent or higher quality in both the highlight press life and solid press life, compared to PS plate FNSA. Further, the PS plate of the present invention exhibits equivalent or higher quality in degree of thin lines dropping out during printing, compared to PS plate FNSA. In the present invention, the halftone dots of the lithographic printing plates exhibit good clearness at the peripheral portions thereof, evenness, uniformity, less roughness, and less fluctuation in dimension between the halftone dots. Scumming in non-image areas and stains on a blanket which may become an issue for practical use are not observed by inspection at all.

The present invention is illustrated below by the following examples in more detail. However, the present invention is not limited to these examples. All percents, parts, ratios and the like are by weight unless otherwise indicated.

EXAMPLES 1 TO 9

Aluminum plates JIS A 1050 having a thickness of 0.24 mm were subjected to three types of surface treatments A, B and C, respectively, which gave surface graining forms different from one another, dipped in an 1% aqueous solution of sodium hydroxide at 40° C. for 30 sec, and then dipped in 30% sulfuric acid at 60° C. for 40 sec to desmut. Subsequently, the plates were anodized in 20% sulfuric acid at a current density of 2 A/dm² using a direct current so as to become 2.7 g/m² in weight of oxide layer formed, thus preparing substrates (hereinafter referred to as "AD substrates").

[Surface Treatment A]

The aluminum plates were subjected to brush graining using a nylon brush having hair diameters of 0.57 to 0.72 mm at variously applied pressures of the brush, while feeding a suspension of pumistone and water to the surfaces of the plates. Subsequently, the plates were sufficiently washed with water, dipped in a 10% aqueous solution of sodium hydroxide at 60° C. for 25 sec to etch the surfaces thereof, washed with running water, neutralized and washed with 20% nitric acid, and then washed again with water. Electrolytic surface-roughening treatment of the plates was conducted in an 1% aqueous solution of nitric acid at a quantity of electricity on an anode of 100 to 600 coulombs/dm² using alternating wave shape current of sine wave.

[Surface Treatment B]

After a roller oil was removed from the surfaces of the plates with 10% sodium hydroxide, the plates were neutralized and washed with 20% nitric acid, and washed with water. Electrolytic surface-roughening treatment of the plates was conducted in an 1% electrolytic solution of nitric acid at a quantity of electricity on an anode of 100 to 600 coulombs/dm².

[Surface Treatment C]

After a roller oil was removed from the surfaces of the plates with 10% sodium hydroxide, the plates were neutralized and washed with 20% nitric acid, and washed with water. Electrolytic surface-roughening treatment of the plates was conducted in an 1% electrolytic solution of hydrochloric acid at a quantity of electricity on an anode of 100 to 600 coulombs/dm².

Subsequently, a liquid composition [sol (1)] for the SG method was prepared according to the following procedure. After 18.7 g of tetraethyl orthosilicate, 1.3 g of 3-methacryloxypropyltrimethoxysilane, 50 g of methanol, 7.2 g of ion-exchanged water, and 6.1 g of phosphoric acid were placed in a 100-ml flask in this order, the flask was immediately immersed in a water bath maintained at a temperature of 23° C. and the contents of the flask were stirred with a magnetic stirrer. The flask was equipped with a reflux condenser under these conditions, and stirring was continued for 60 min. The contents of the flask were then poured into a plastic vessel, and a 10-fold amount of methanol was immediately added thereto, based on the weight of the contents, to obtain sol (1).

Subsequently, a laser beam-sensitive PS plate was prepared from an AD substrate and sol (1) according to the following procedure. Sol (1) was diluted with a mixture of methanol and ethylene glycol (weight ratio 9:1), and applied to the AD substrate with a whirler so as to be 3 mg/m² in amount of silicon, and then dried at 100° C. for 1 min.

Highly sensitive photopolymerizable composition 1 having the following composition was applied to the AD substrate thus treated so as to be 1.4 g/m² in coating weight after drying, and then dried at 80° C. for 2 min to form a photosensitive layer.

| Photopolymerizable Composition 1: | |
|---|---|
| Trimethylolpropane Tri(acryloyloxy-propyl) Ether | 2.0 g |
| Organic Linear Polymer (B₁) | 2.0 g |
| Sensitizer (C₁) (λ$_{max}^{THF}$ 427 nm, ε = 7.4 × 10⁴) | 0.13 g |
| Photopolymerization Initiator (D₁) | 0.09 g |
| Thio Compound (E₁) | 0.08 g |
| Fluorine Type Nonionic surfactant | 0.03 g |
| Methyl Ethyl Ketone | 20 g |
| Propylene Glycol Monomethyl Ether Acetate | 20 g |

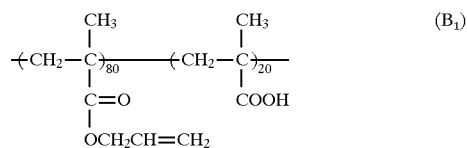

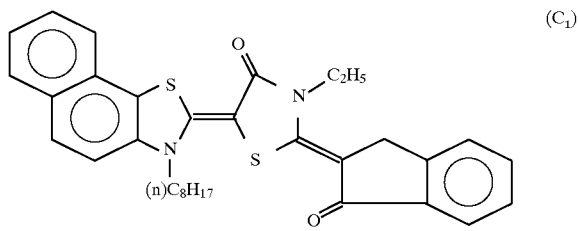

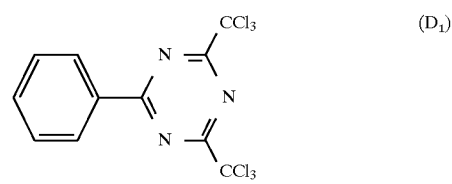

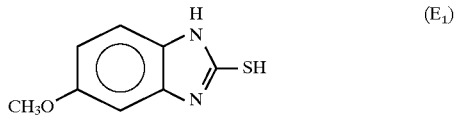

A 3% by weight of aqueous polyvinyl alcohol (a degree of saponification: 86.5 to 89 mol %, a degree of polymerization: 1,000) was applied to the photosensitive layer so as to be 2 g/m² in coating weight after drying, and then dried at 100° C. for 2 min to prepare photosensitive lithographic printing plates A1 to A9 of the present invention and photosensitive lithographic printing plates B1 to B6 of the comparative examples. The results are shown in Table 2 together with values of the surface roughness (Ra) of the supports measured with a stylus 2 μmR by use of stylus meter SURFCOM manufactured by Tokyo Seimitsu Co., Ltd.

TABLE 2

| Photosensitive Lithographic Printing Plate | Surface Treatment | Ra (μm) | Sol | Photosensitive Composition |
|---|---|---|---|---|
| Example 1 | A1 | A | 0.41 | sol (1) | composition 1 |
| Example 2 | A2 | A | 0.46 | sol (1) | composition 1 |
| Example 3 | A3 | A | 0.52 | sol (1) | composition 1 |
| Example 4 | A4 | A | 0.59 | sol (1) | composition 1 |
| Comparative Example 1 | B1 | A | 0.72 | sol (1) | composition 1 |
| Comparative Example 2 | B2 | A | 0.84 | sol (1) | composition 1 |
| Example 5 | A5 | B | 0.30 | sol (1) | composition 1 |
| Example 6 | A6 | B | 0.35 | sol (1) | composition 1 |
| Example 7 | A7 | B | 0.53 | sol (1) | composition 1 |
| Example 8 | A8 | B | 0.56 | sol (1) | composition 1 |
| Comparative Example 3 | B3 | B | 0.64 | sol (1) | composition 1 |

| Photosensitive Lithographic Printing Plate | Surface Treatment | Photosensitive Ra (μm) | Sol | Composition |
|---|---|---|---|---|
| Example 9 | A9 | C | 0.49 | sol (1) | composition 1 |
| Comparative Example 4 | B4 | C | 0.65 | sol (1) | composition 1 |
| Comparative Example 5 | B5 | C | 0.71 | sol (1) | composition 1 |
| Comparative Example 6 | B6 | C | 0.80 | sol (1) | composition 1 |

The test of photosensitivity of these photosensitive lithographic printing plates A1 to A9 and B1 to B6 was conducted by use of a visible light having a wavelength of 488 nm. Exposure was carried out at 0.1 mJ/cm$^2$ in 4,000 dpi by use of a highly narrowed laser plotter equipped with an air-cooled argon laser of 200 mW which is manufactured by Optronics Co., Ltd. To improve a degree of cure, the films were heat treated at 110° C. for 12 sec after exposure. Development was carried out by dipping the lithographic printing plates at 30° C. for 15 sec in developer DP-A manufactured by Fuji Photo Film Co., Ltd. which was diluted 18 times with water by use of automatic processor 850NX manufactured by Fuji Photo Film Co., Ltd.

The shape of 2 to 98% halftone dots in 175 lines/in was observed with the aid of a 400-fold optical microscope, and as a result, the halftone dots of the lithographic printing plates A1 to A9 of the present invention were found to be good in clearness at the peripheral portions thereof, evenness, uniformity, and dimensional precision. On the other hand, in lithographic printing plates B1 to B6 of the comparative examples, roughness was observed in the whole halftone dots and each of the halftone dots indicated minute difference in shape.

The measurement of the press life of these lithographic printing plates was subsequently carried out.

Printing machine SOR-KZ manufactured by Heidelberg Co., Ltd. was used for this purpose; a dampening solution used was EU-3 (1:100) manufactured by Fuji Photo Film Co., Ltd. to which 10% of 2-propanol was added; and ink was Craph G (N) manufactured by Dainippon Ink and Chemicals, Inc. Scumming in non-image areas and stains on a blanket were observed by inspection at the same time.

As to resistance to stains, in all of 16 printing plates tested, no stain was observed and no difference was recognized among them. A press life in image areas (hereinafter referred to as a "solid press life") which is an important index of press lives and a highlight press life were evaluated, and the results are shown in the following table. The solid press life means the maximum number of sheets printed normally without any clear in solid printed areas. The highlight press life means the maximum number of sheets in which 2% halftone dots in 175 lines/in can be reproduced on printed sheets, and relative values are shown in the table in which the result of the evaluation of PS plate FNSA manufactured by Fuji Photo Film Co., Ltd. is assumed as 100. That is, PS plate FNSA was image-exposed with PS Light manufactured by Fuji Photo Film Co., Ltd. from a distance of 1 m for 1 min by use of a negative film, and processed with the aid of automatic processor PS-800H manufactured by the same corporation by use of aqueous alkali developer DN-3C manufactured by Fuji Photo Film Co., Ltd. which is diluted twofold with tap water and gum solution FN-2 manufactured by the same corporation which is diluted twofold with tap water. Thereafter, impression capacity of PS plate FNSA was determined as the maximum number of printed sheets by use of the above-mentioned printing machine, and the number is assumed to be 100 as a standard to indicate the relative values of the press life of examples 1 to 9 and comparative examples 1 to 6. In the table, "good" indicates that the relative value of a plate is equivalent (100±5) to that of PS plate FNSA (100), "excellent" indicates that the relative value of a plate is larger than that of PS plate FNSA, "poor" indicates that the relative value of a plate is 80 or less (80% or less to the value of PS plate FNSA), and "fair" indicates that the relative value is between the values indicated by "good" and "poor".

TABLE 3

| Solid Photosensitive Lithographic Printing Plate | Press Ra (μm) | Highlight Press Life | Life |
|---|---|---|---|
| Example 1 | A1 | 0.41 | Good | Excellent |
| Example 2 | A2 | 0.46 | Good | Excellent |
| Example 3 | A3 | 0.52 | Good | Excellent |
| Example 4 | A4 | 0.59 | Good | Excellent |
| Comparative Example 1 | B1 | 0.72 | Fair | Excellent |
| Comparative Example 2 | B2 | 0.84 | Poor | Excellent |
| Example 5 | A5 | 0.30 | Good | Excellent |
| Example 6 | A6 | 0.35 | Good | Excellent |
| Example 7 | A7 | 0.53 | Good | Excellent |
| Example 8 | A8 | 0.56 | Good | Excellent |
| Comparative Example 3 | B3 | 0.64 | Fair | Excellent |
| Example 9 | A9 | 0.49 | Good | Excellent |
| Comparative Example 4 | B4 | 0.65 | Fair | Excellent |
| Comparative Example 5 | B5 | 0.71 | Fair | Excellent |
| Comparative Example 6 | B6 | 0.80 | Poor | Excellent |

The photosensitive lithographic printing plates which have a surface roughness of 0.60 μm or less of the present invention undergo no deterioration in highlight press life, and are equivalent to PS plate FNSA in solid press life. This indicates that they are superior to the lithographic printing plates of the comparative examples in which the surface roughness of the supports exceeds 0.60.

EXAMPLES 10 TO 12

Similarly to example 1, sols (2) to (4) were prepared from mixtures having the following compositions.

| Sol (2): | |
|---|---|
| $Si(OC_2H_5)_4$ | 18.7 g |
| 3-Acryloxypropyltrimethoxysilane | 1.2 g |
| Methanol | 50 g |
| Ion-Exchanged Water | 7.2 g |
| Phosphoric Acid | 6.1 g |

| Sol (3): | |
|---|---|
| $Si(OC_2H_5)_4$ | 18.7 g |
| Allyltriethoxysilane | 1.1 g |
| Methanol | 50 g |
| Ion-Exchanged Water | 7.2 g |
| Phosphoric Acid | 6.1 g |

| Sol (4): | |
|---|---|
| $Si(OC_2H_5)_4$ | 18.7 g |
| Triethoxyvinyl silane | 1.0 g |
| Methanol | 50 g |
| Ion-Exchanged Water | 7.2 g |
| Phosphoric Acid | 6.1 g |

Sols (2) to (4) were applied to AD substrates similarly to examples 1 to 9 and comparative examples 1 to 6, and then dried to obtain supports. Photopolymerizable composition 1 was applied to the supports thus obtained so as to be 1.4 g/m² in coating weight after drying, and then dried at 80° C. for 2 min to form photosensitive layers. A polyvinyl alcohol layer was further formed on the respective photosensitive layers similarly to example 1 to obtain photosensitive lithographic printing plates A10 to A12 of the present invention and photosensitive lithographic printing plates B7 to B9 of the comparative examples.

Similarly to example 1, these photosensitive lithographic printing plates were image-exposed, heated at 110° C. for 12 sec, and then developed to undergo the test of printing. Results are shown in the following table.

TABLE 4

| Photosensitive Lithographic Printing Plate | Surface Treatment | Ra (μm) | Sol | Photosensitive Composition | Solid Press Life | Highlight Press Life |
|---|---|---|---|---|---|---|
| Example 10 | A10 | B | 0.30 | sol 2 | composition 1 | Good | Excellent |
| Comparative Example 7 | B7 | B | 0.64 | sol 2 | composition 1 | Fair | Excellent |
| Example 11 | A11 | B | 0.31 | sol 3 | composition 1 | Good | Excellent |
| Comparative Example 8 | B8 | B | 0.63 | sol 3 | composition 1 | Fair | Excellent |
| Example 12 | A12 | B | 0.30 | sol 4 | composition 1 | Good | Good |
| Comparative Example 9 | B9 | B | 0.65 | sol 4 | composition 1 | Poor | Good |

The photosensitive lithographic printing plates of the present invention in which the supports have a surface roughness Ra of 0.60 μm or less undergo no deterioration in highlight press life, and are equivalent to PS plate FNSA in solid press life. This indicates that they are superior to the lithographic printing plates of the comparative examples in which the surface roughness of the supports exceeds 0.60 μm.

The shape of 2 to 98% halftone dots in 175 lines/in was observed with the aid of a 400-fold optical microscope, and as a result, the halftone dots of lithographic plates A10 to A12 of the present invention are good in clearness at the peripheral portions, evenness, uniformity, and dimensional precision. On the other hand, in lithographic printing plates B7 to B9 of the comparative examples, roughness was observed in the whole halftone dots, and each of halftone dots was found to indicate minute difference in shape.

EXAMPLES 13 TO 18

Sol (1) was applied to the AD substrates similarly to examples 1 to 9 and comparative examples 1 to 6, and then dried to obtain supports. Photopolymerizable compositions 2 to 7 having the following compositions are applied to the supports, and then dried at 80° C. for 2 min to form the respective photosensitive layers. Similarly to example 1, a polyvinyl alcohol layer was further applied to the photosensitive layers to obtain photosensitive lithographic printing plates A13 to A18 of the present invention and photosensitive lithographic printing plates B10 to B15 of the comparative examples.

Photopolymerizable Composition 2:

| | |
|---|---|
| Trimethylolpropane Tri(acryloyloxypropyl) Ether | 2.0 g |
| Organic Linear Polymer (B$_1$) | 2.0 g |
| Sensitizer (C$_2$) ($\lambda_{max}^{THF}$ 474 nm, $\epsilon$ = 7.4 × 10$^4$) | 0.13 g |
| Photopolymerization Initiator (D$_1$) | 0.09 g |
| Fluorine Type Nonionic Surfactant | 0.03 g |
| Methyl Ethyl Ketone | 20 g |
| Propylene Glycol Monomethyl Ether Acetate | 20 g |

Sensitizer (C$_2$)

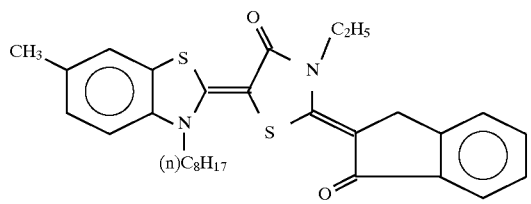

Photopolymerizable Composition 3:

| | |
|---|---|
| Pentaerythritol Tetraacrylate | 2.0 g |
| Organic Linear Polymer (B$_1$) | 2.0 g |
| Sensitizer (C$_2$) | 0.13 g |
| Photopolymerization Initiator (D$_2$) | 0.1 g |
| Thio Compound (E$_2$) | 0.07 g |
| Fluorine Type Nonionic Surfactant | 0.03 g |
| Methyl Ethyl Ketone | 20 g |
| Propylene Glycol Monomethyl Ether Acetate | 20 g |

Photopolymerization Initiator (D$_2$)

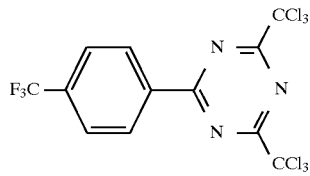

Thio Compound (E$_2$)

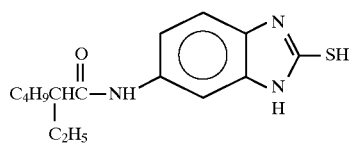

Photopolymerizable Composition 4:

| | |
|---|---|
| Pentaerythritol Triacrylate | 2.0 g |
| Organic Linear Polymer (B$_1$) | 2.0 g |
| Sensitizer (C$_2$) | 0.13 g |
| Photopolymerization Initiator (D$_2$) | 0.1 g |
| Thio Compound (E$_2$) | 0.07 g |
| Fluorine Type Nonionic Surfactant | 0.03 g |
| Methyl Ethyl Ketone | 20 g |
| Propylene Glycol Monomethyl Ether Acetate | 20 g |

Photopolymerizable Composition 5:

| | |
|---|---|
| Pentaerythritol Tetraacrylate | 2.0 g |
| Organic Linear Polymer (B$_1$) | 2.0 g |
| Sensitizer (C$_2$) | 0.13 g |
| Photopolymerization Initiator (D$_3$) | 0.1 g |
| Additive (I) | 0.2 g |
| Fluorine Type Nonionic Surfactant | 0.03 g |
| Methyl Ethyl Ketone | 20 g |
| Propylene Glycol Monomethyl Ether Acetate | 20 g |

Photopolymerization Initiator (D$_3$)

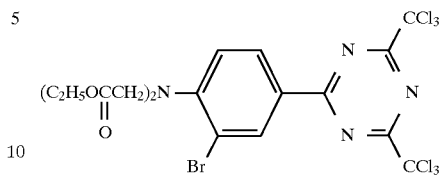

Additive (I)

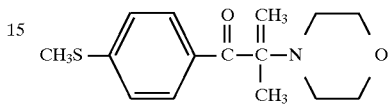

Photopolymerizable Composition 6:

| | |
|---|---|
| Pentaerythritol Tetraacrylate | 2.0 g |
| Organic Linear Polymer (B$_1$) | 2.0 g |
| Sensitizer (C$_3$) | 0.13 g |
| Photopolymerization Initiator (D$_2$) | 0.1 g |
| Additive (I) | 0.2 g |
| Fluorine Type Nonionic Surfactant | 0.03 g |
| Methyl Ethyl Ketone | 20 g |
| Propylene Glycol Monomethyl Ether Acetate | 20 g |

Sensitizer (C$_3$)

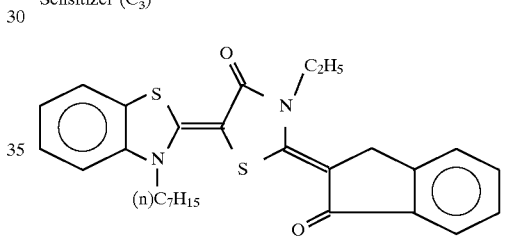

Photopolymerizable Composition 7:

| | |
|---|---|
| Pentaerythritol Tetraacrylate | 2.0 g |
| Organic Linear Polymer (B$_1$) | 2.0 g |
| Sensitizer (C$_4$) | 0.13 g |
| Photopolymerization Initiator (D$_2$) | 0.1 g |
| Additive (I) | 0.2 g |
| Fluorine Type Nonionic Surfactant | 0.03 g |
| Methyl Ethyl Ketone | 20 g |
| Propylene Glycol Monomethyl Ether Acetate | 20 g |

Sensitizer (C$_4$)

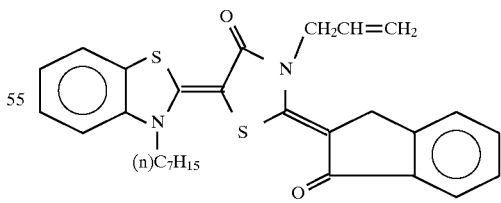

Similarly to example 1, these photosensitive lithographic printing plates are image-exposed, heated at 110° C. for 12 sec, and then developed. As to these printing plates, a test of printing was carried out, and results are shown in Table 5.

TABLE 5

| | Photosensitive Lithographic Printing Plate | Surface Treatment | Ra (μm) | Sol | Photosensitive Composition | Solid Press Life | Highlight Press Life |
|---|---|---|---|---|---|---|---|
| Example 13 | A13 | B | 0.30 | sol 1 | composition 2 | Good | Excellent |
| Comparative Example 10 | B10 | B | 0.65 | sol 1 | composition 2 | Poor | Excellent |
| Example 14 | A14 | B | 0.29 | sol 1 | composition 3 | Good | Excellent |
| Comparative Example 11 | B11 | B | 0.64 | sol 1 | composition 3 | Fair | Excellent |
| Example 15 | A15 | B | 0.32 | 1 | composition 4 | Good | Excelleht |
| Comparative Example 12 | B12 | B | 0.64 | sol 1 | composition 4 | Fair | Excellent |
| Example 16 | A16 | B | 0.31 | sol 1 | composition 5 | Good | Good |
| Comparative Example 13 | B13 | B | 0.63 | sol 1 | composition 5 | Fair | Good |
| Example 17 | A17 | B | 0.30 | 501 1 | composition 6 | Good | Excellent |
| Comparative Example 14 | B14 | B | 0.62 | sol 1 | composition 6 | Fair | Excellent |
| Example 18 | A18 | B | 0.30 | sol 1 | composition 7 | Good | Excellent |
| Comparative Example 15 | B15 | B | 0.64 | sol 1 | composition 7 | Fair | Excellent |

The photosensitive lithographic printing plates of the present invention which were prepared by using the supports having surface roughness, Ra, of 0.60 μm or less underwent no deterioration in highlight press life, and were equivalent to PS plate FNSA in solid press life. They were superior to the lithographic printing plates of the comparative examples in which the surface roughness of the supports exceeded 0.60 μm.

The shape of 2 to 98% halftone dots in 175 lines/in was observed with the aid of a 400-fold optical microscope, and as a result, the halftone dots of lithographic printing plates A13 to A18 of the present invention are good in clearness at the peripheral portions thereof, evenness, uniformity, and dimensional precision. On the other hand, in lithographic printing plates B10 to B15 of the comparative examples, roughness was observed in the whole halftone dots, and each of the halftone dots was found to indicate minute difference in shape.

While the invention has been described in detail and with reference to specific embodiments thereof, it will be apparent to one skilled in the art that various changes and modifications can be made therein without departing from the spirit and scope thereof.

What is claimed is:

1. A negative photosensitive lithographic printing plate comprising an aluminum or organic polymer support having a surface roughness Ra of 0.25 to 0.60 μm and having provided thereon in sequence, (a) a layer containing an organic-inorganic composite formed by coating a solution containing a polymer having a Si—O—Si bond, which is obtained by subjecting an organic silicon compound represented by formula (1) and an organic silicon compound represented by formula (3) to hydrolysis and polycondensation, followed by drying:

$$R_1Si(R_2)_3 \quad (1)$$

$$Si(R_4)_4 \quad (3)$$

wherein $R_1$ represents an addition-reactive functional group; and $R_2$ represents a hydrolyzable alkoxy group or —OCOCH$_3$; and $R_4$ represents a hydrolyzable group, and (b) a photopolymerizable photosensitive layer comprising a polymerizable monomer, a photopolymerization initiator and a sensitizer having an absorption wavelength of 400 to 1,000 nm.

2. The negative photosensitive lithographic printing plate as claimed in claim 1, wherein the surface roughness Ra is 0.30 to 0.55 μm.

3. The negative photosensitive lithographic printing plate as claimed in claim 1, wherein the polymerizable monomer is a compound containing at least one terminal ethylenic unsaturated bond.

4. The negative photosensitive lithographic printing plate as claimed in claim 1, wherein the photopolymerizable photosensitive layer contains an organic linear polymer.

5. The negative photosensitive lithographic printing plate as claimed in claim 1, wherein the sensitizer has an absorption wavelength of 400 to 750 nm.

6. A negative photosensitive lithographic printing plate prepared by:

on an aluminum or organic polymer support having a surface roughness Ra of 0.25 to 0.60 μm, (a) coating a solution containing a polymer having a Si—O—Si bond, which is obtained by subjecting an organic silicon compound represented by formula (1) and an organic silicon compound represented by formula (3) to hydrolysis and polycondensation, followed by drying:

$$R_1Si(R_2)_3 \quad (1)$$

$$Si(R_4)_4 \quad (3)$$

wherein $R_1$ represents an addition-reactive functional group; and $R_2$ represents a hydrolyzable alkoxy group or —OCOCH$_3$; and $R_4$ represents a hydrolyzable group, and (b) subsequently forming a photopolymerizable photosensitive layer comprising a polymerizable monomer, a photopolymerization initiator and a sensitizer having an absorption wavelength of 400 to 1,000 nm.

7. The negative photosensitive lithographic printing plate as claimed in claim 6, wherein the surface roughness Ra is 0.30 to 0.55 μm.

8. The negative photosensitive lithographic printing plate as claimed in claim 6, wherein the polymerizable monomer is a compound containing at least one terminal ethylenic unsaturated bond.

9. The negative photosensitive lithographic printing plate as claimed in claim 6, wherein the photopolymerizable photosensitive layer contains an organic linear polymer.

10. The negative photosensitive lithographic printing plate as claimed in claim 6, wherein the sensitizer has an absorption wavelength of 400 to 750 nm.

11. A negative photosensitive lithographic printing plate comprising an aluminum or organic polymer support having a surface roughness Ra of 0.25 to 0.60 μm and having coated thereon an organic silicon compound represented by formula (1):

$$R_1Si(R_2)_3 \quad (1)$$

wherein $R_1$ represents an addition-reactive functional group and $R_2$ represents a hydrolyzable alkoxy group or —OCOCH$_3$, said support having on the organic silicon compound coated side a photopolymerizable photosensitive layer comprising a polymerizable monomer, a photopolymerization initiator and a sensitizer having an absorption wavelength of 400 to 1,000 nm.

12. The negative photosensitive lithographic printing plate as claimed in claim 11, wherein the surface roughness Ra is 0.30 to 0.55 μm.

13. The negative photosensitive lithographic printing plate as claimed in claim 11, wherein the polymerizable monomer is a compound containing at least one terminal ethylenic unsaturated bond.

14. The negative photosensitive lithographic printing plate as claimed in claim 11, wherein the photopolymerizable photosensitive layer contains an organic linear polymer.

15. The negative photosensitive lithographic printing plate as claimed in claim 11, wherein the sensitizer has an absorption wavelength of 400 to 750 nm.

* * * * *